(12) United States Patent
Bhakta et al.

(10) Patent No.: US 7,619,912 B2
(45) Date of Patent: Nov. 17, 2009

(54) MEMORY MODULE DECODER

(75) Inventors: Jayesh R. Bhakta, Cerritos, CA (US); Jeffrey C. Solomon, Irvine, CA (US)

(73) Assignee: Netlist, Inc., Irvine, CA (US)

( * ) Notice: Subject to any disclaimer, the term of this patent is extended or adjusted under 35 U.S.C. 154(b) by 307 days.

(21) Appl. No.: 11/862,931

(22) Filed: Sep. 27, 2007

(65) Prior Publication Data

US 2008/0068900 A1    Mar. 20, 2008

Related U.S. Application Data

(63) Continuation of application No. 11/173,175, filed on Jul. 1, 2005, now Pat. No. 7,289,386, and a continuation-in-part of application No. 11/075,395, filed on Mar. 7, 2005, now Pat. No. 7,286,436.

(60) Provisional application No. 60/588,244, filed on Jul. 15, 2004, provisional application No. 60/550,668, filed on Mar. 5, 2004, provisional application No. 60/575,595, filed on May 28, 2004.

(51) Int. Cl.
*G11C 15/02* (2006.01)

(52) U.S. Cl. .................. 365/51; 365/230.06; 365/233.1; 365/233.13; 711/105; 711/115

(58) Field of Classification Search .................. 365/51, 365/230.06, 233.1, 233.13; 711/105, 115
See application file for complete search history.

(56) References Cited

U.S. PATENT DOCUMENTS 4,368,515 A    1/1983    Nielsen

| | | |
|---|---|---|
| 4,392,212 A | 7/1983 | Miyasaka et al. |
| 4,633,429 A | 12/1986 | Lewandowski et al. |
| 4,670,748 A | 6/1987 | Williams |
| 4,958,322 A | 9/1990 | Kosugi et al. |

(Continued)

FOREIGN PATENT DOCUMENTS

WO    WO 92/02879    2/1992

(Continued)

OTHER PUBLICATIONS

Abali, B. "Memory Expansion Technology (MXT): Software Support and Performance," IBM J. Res. & Dev., vol. 45, No. 2, 2001, pp. 287-300.

(Continued)

*Primary Examiner*—Tuan T Nguyen
*Assistant Examiner*—Alexander Sofocleous
(74) *Attorney, Agent, or Firm*—Knobbe Martens Olson & Bear LLP

(57) ABSTRACT

A memory module connectable to a computer system includes a printed circuit board, a plurality of memory devices coupled to the printed circuit board, and a logic element coupled to the printed circuit board. The plurality of memory devices has a first number of memory devices. The logic element receives a set of input control signals from the computer system. The set of input control signals corresponds to a second number of memory devices smaller than the first number of memory devices. The logic element generates a set of output control signals in response to the set of input control signals. The set of output control signals corresponds to the first number of memory devices.

51 Claims, 18 Drawing Sheets

U.S. PATENT DOCUMENTS

| | | | |
|---|---|---|---|
| 4,961,172 A | 10/1990 | Shubat et al. | |
| 4,980,850 A | 12/1990 | Morgan | |
| 5,247,643 A | 9/1993 | Shottan | |
| 5,345,412 A | 9/1994 | Shiratsuchi | |
| 5,426,753 A | 6/1995 | Moon | |
| 5,483,497 A | 1/1996 | Mochizuki et al. | |
| 5,495,435 A * | 2/1996 | Sugahara | 365/52 |
| 5,581,498 A | 12/1996 | Ludwig et al. | |
| 5,590,071 A | 12/1996 | Kolor et al. | |
| 5,699,542 A | 12/1997 | Mehta et al. | |
| 5,702,984 A | 12/1997 | Bertin et al. | |
| 5,703,826 A | 12/1997 | Hush et al. | |
| 5,745,914 A | 4/1998 | Connolly et al. | |
| 5,802,395 A | 9/1998 | Connolly et al. | |
| 5,805,520 A | 9/1998 | Anglada et al. | |
| 5,822,251 A | 10/1998 | Bruce et al. | |
| RE36,229 E | 6/1999 | Cady | |
| 5,926,827 A | 7/1999 | Dell et al. | |
| 5,959,930 A | 9/1999 | Sakurai | |
| 5,963,464 A | 10/1999 | Dell et al. | |
| 5,966,736 A | 10/1999 | Gittinger et al. | |
| 6,018,787 A | 1/2000 | Ip | |
| 6,070,217 A | 5/2000 | Connolly et al. | |
| 6,070,227 A | 5/2000 | Rokicki | |
| 6,108,745 A | 8/2000 | Gupta et al. | |
| 6,154,418 A | 11/2000 | Li | |
| 6,185,654 B1 | 2/2001 | Van Doren | |
| 6,209,074 B1 | 3/2001 | Dell et al. | |
| 6,226,709 B1 | 5/2001 | Goodwin et al. | |
| 6,408,356 B1 | 6/2002 | Dell | |
| 6,414,868 B1 | 7/2002 | Wong et al. | |
| 6,453,381 B1 | 9/2002 | Yuan et al. | |
| 6,470,417 B1 | 10/2002 | Kolor et al. | |
| 6,502,161 B1 | 12/2002 | Perego et al. | |
| 6,518,794 B2 | 2/2003 | Coteus et al. | |
| 6,553,450 B1 | 4/2003 | Dodd et al. | |
| 6,646,949 B1 | 11/2003 | Ellis et al. | |
| 6,674,684 B1 | 1/2004 | Shen | |
| 6,681,301 B1 | 1/2004 | Mehta et al. | |
| 6,697,888 B1 | 2/2004 | Halbert et al. | |
| 6,705,877 B1 * | 3/2004 | Li et al. | 439/74 |
| 6,742,098 B1 | 5/2004 | Halbert et al. | |
| 6,785,189 B2 | 8/2004 | Jacobs et al. | |
| 6,807,125 B2 | 10/2004 | Coteus et al. | |
| 6,813,196 B2 | 11/2004 | Park et al. | |
| 6,834,014 B2 | 12/2004 | Yoo et al. | |
| 6,944,694 B2 | 9/2005 | Pax | |
| 6,961,281 B2 | 11/2005 | Wong et al. | |
| 6,981,089 B2 | 12/2005 | Dodd et al. | |
| 6,982,892 B2 | 1/2006 | Lee et al. | |
| 6,982,893 B2 | 1/2006 | Jakobs | |
| 6,996,686 B2 | 2/2006 | Doblar et al. | |
| 7,007,130 B1 | 2/2006 | Holman | |
| 7,007,175 B2 | 2/2006 | Chang et al. | |
| 7,120,727 B2 | 10/2006 | Lee et al. | |
| 7,124,260 B2 | 10/2006 | LaBerge et al. | |
| 7,133,960 B1 | 11/2006 | Thompson et al. | |
| 7,133,972 B2 | 11/2006 | Jeddeloh | |
| 7,167,967 B2 * | 1/2007 | Bungo et al. | 711/200 |
| 7,181,591 B2 | 2/2007 | Tsai | |
| 7,200,021 B2 | 4/2007 | Raghuram | |
| 7,266,639 B2 | 9/2007 | Raghuram | |
| 7,281,079 B2 | 10/2007 | Bains et al. | |
| 7,289,386 B2 | 10/2007 | Bhakta et al. | |
| 7,346,750 B2 | 3/2008 | Ishikawa | |
| 7,356,639 B2 | 4/2008 | Perego et al. | |
| 7,437,591 B1 * | 10/2008 | Wong | 713/503 |
| 7,471,538 B2 * | 12/2008 | Hofstra | 365/51 |
| 2001/0003198 A1 | 6/2001 | Wu | |
| 2001/0052057 A1 | 12/2001 | Lai | |
| 2002/0088633 A1 | 7/2002 | Kong et al. | |
| 2003/0063514 A1 | 4/2003 | Faue | |
| 2003/0090879 A1 | 5/2003 | Doblar et al. | |
| 2003/0191995 A1 | 10/2003 | Abrosimov et al. | |
| 2003/0210575 A1 | 11/2003 | Seo et al. | |
| 2004/0037158 A1 | 2/2004 | Coteus et al. | |
| 2004/0201968 A1 | 10/2004 | Tafolla | |
| 2005/0036378 A1 | 2/2005 | Kawaguchi et al. | |
| 2005/0281096 A1 | 12/2005 | Bhakta et al. | |
| 2006/0044860 A1 | 3/2006 | Kinsley et al. | |
| 2006/0117152 A1 | 6/2006 | Amidi et al. | |
| 2006/0126369 A1 | 6/2006 | Raghuram | |
| 2006/0129755 A1 | 6/2006 | Raghuram | |
| 2006/0179206 A1 | 8/2006 | Brittain et al. | |
| 2006/0267172 A1 | 11/2006 | Nguyen et al. | |
| 2006/0277355 A1 * | 12/2006 | Ellsberry et al. | 711/5 |

FOREIGN PATENT DOCUMENTS

| | | |
|---|---|---|
| WO | WO 94/07242 | 3/1994 |
| WO | WO 95/34030 | 12/1995 |
| WO | WO 02/58069 | 7/2002 |
| WO | WO 03/017283 | 2/2003 |
| WO | WO 03/069484 | 8/2003 |
| WO | WO 2006/055497 | 5/2006 |

OTHER PUBLICATIONS

Arlington, DL Evans. "Enhancement of Memory Card Redundant Bit Usage Via Simplified Fault Alignment Exclusion," IMB Technical Disclosure Bulletin, 1987.

Arroyo et al. "Method of executing Manufacturing ROM Code Without Removing System Roms," IP.com, IPCOM000037214D, 1989.

"Bank Striping of Data Across Internal SDRAM Banks," IP.com, IPCOM000013697D, 2000.

Barr, Michael. "Programmable Logic: What's it to Ya?," Embedded Systems Programming, Jun. 1999, pp. 75-84.

Bennayoun et al. "Input/Output Chip Select Doubler," IBM Technical Disclosure Bulletin, vol. 38, No. 04 1995, pp. 237-240.

Blum et al. "Fast Multichip Memory System With Power Select Signal," IMB Technical Disclosure Bulletin, 1979.

Cuppu et al. "A Performance Coparison of Contemporary DRAM Architectures," *IEEE Proceedings of the 26th International Symposium on Computer Architectures*, May 2-4, 1999, Atlanta, Georgia, pp. 1-12.

Cuppu et al. "Concurrency, Latency, or System Overhead: Which Has the Largest Impact on Uniprocessor DRAM-System Performance?," IEEE, 2001, pp. 62-71.

Cuppu et al. " High-Performance DRAMs in Workstation Environments," IEEE Transactions on Computers, vol. 50, No. 11, 2001, pp. 1133-1153.

Denneau, M. "Logic Processor For Logic Simulation Machine," IBM Technical Disclosure Bulletin, vol. 25, No. 1, 1982.

"Distributed Memory Mapping," IP.com, IPCOM000014788D, 2000.

Fairchild Semiconductor. "DM74LS138 DM74LS139 Decoder/Demultiplexer," Fairchild Semiconductor Corporation, 2000.

Fitzgerald et al. "Chip Select Circuit for Multi-Chip RAM Modules," IP.com, IPCOM000044404D, 1984.

Gray, KS. "Fet Ram Chip Double Density Scheme," IP.com, IPCOM000043942D, 1984.

Grimes et al. "Access Rate/Availability Improvement Logic for Dynamic Memories," IBM Technical Disclosure Bulletin, Oct. 1982.

Gupta et al. "Designing and Implementing a Fast Crossbar Scheduler," IEEE Micro, 1999, pp. 20-28.

Hession et al. "Chip Select Technique for Multi Chip Decoding," IP.com, IPCOM000070404D, 1985.

Hewlett-Packard. "Memory technology evolution: an overview of system memory technologies," technology brief, 7th edition. 2003.

Hoare et al. "An 88-Way Multiprocessor Within An FPGA With Customizable Instructions," Proceedings of the 18th International Parallel and Distributed Processing Symposium, 2004.

"Information Huawei or FPGA-Take Five," Electronic News, 2002, p. 24.

Jin et al. "Embedded Memory in System-On-Chip Design: Architecture and Prototype Implementation," CCECE, 2003, pp. 141-146.

Intel Corporation, PC SDRAM Registered DIMM Design Support Document, Revision 1.2, Oct. 1998.

Intel Corporation, 66/100 MHz PC SDRAM 64-Bit Non-ECC/Parity 144 Pin Unbuffered SO-DIMM Specification, Revision 1.0, Feb. 1999.

JEDEC Standard No. 21-C, 4.20-2-168 Pin, PC133 SDRAM Registered Design Specification, Revision 1.4, Release 11a, Feb. 2002.

JEDEC Standard No. 21-C, 4.20-2-168 Pin, PC133 SDRAM Registered SO-DIMM, Reference Design Specification, Revision 1.02, Release 11. Published Oct. 2003.

JEDEC Standard No. 21-C, DDR SDRAM PC2100 and PC1600 DDR SDRAM Registered DIMM Design Specification, Revision 1.3, Release 11b, Jan. 2002.

JEDEC Standard No. 21-C, 4.20.5-184 Pin. PC1600/2100 DDR SDRAM Unbuffered DIMM Design Specification, Revision 1.1, Release 11b. Published Apr. 2003.

JEDEC Standard No. 21-C, 4.20.5-184 Pin. PC2700/PC2100/PC1600 DDR SDRAM Unbuffered SO-DIMM Reference Design Specification, Revision 1.1, Release 11b, Apr. 26, 2002.

JEDEC Standard JESD79D, "Double Data Rate (DDR) SDRAM Specification," published Feb. 2004.

Jin et al. "Prototype Implementation and Evaluation of a Multibank Embedded Memory Archtecture in Programmable Logic," IEEE, 2003, pp. 13-16.

Kane et al. "Read Only Store Memory Extension," IP.com, IPCOM000082845D, 1975.

Komaros et al. "A Fully-Programmable Memory Management System Optimizing Queue Handling at Multi Gigabit Rates," DAC, 2003, pp. 54-59.

Lee et al. "A banked-promotion translation lookaside buffer system," Journal of Systems Architecture, vol. 47, 2002, pp. 1065-1078.

Lee et al. "An on-chip cache compression technique to reduce decompression overhead and design complexity." Journal of Systems Architecture, vol. 46, 2000, pp. 1365-1382.

Lin et al. "Designing a Modern Memory Hierarchy with Hardware Prefetching," IEEE Transactions on Computers, vol. 50, No. 11, 2001, pp. 1202-1217.

Luthra et al. "Interface Synthesis Using Memory Mapping for an FPGA Platform," Proceedings of the 21st International Conference on Computer Design, 2003.

Matick et al. "Read-Select Capability for Static Random-Access Memory," IMB Technical Disclosure Bulletin, 1985, pp. 6640-6642.

Matick, RE. "Logic and Decoder Arrangement for Controlling Spill/Wrap Boundaries of a Bit-Addressable Memory Decoder," IMB Technical Disclosure Bulletin, 1984.

"Method for a high-performance DRAM address mapping mechanism," IP.com, IPCOM00008164D, 2002.

"Method for memory probing on a multiple-DIMM bus," IP.com, IPCOM0000019063D, 2003.

"Method for multiple device interface testing using a single device," IP.com, IPCOM000010054D, 2002.

Meyers et al. "Use of Partially Good Memory Chips," IP.com, IPCOM000066246D, 1979.

Ofek et al. "Partial Two Way Mapping Technique," IMB Technical Disclosure Bulletin, 1969.

Paldan, David. "Programmable Memory Address Decoding For Microprocessor Memory Device," IP.com, IPCOM000005486D, 1983.

Pellinger et al. "Dual Addressable Memory," IP.com, IPCOM000068610D, 1978.

Plotnick et al. "Shuffle Your Chips For Better Performance," PC Week, 1998, p. 90.

Schubert et al. "Accelerating system integration by enhancing hardware, firmware, and co-simulation," IBM J. Res. & Dev, vol. 48, No. 3/4, May/Jul. 2004, pp. 569-581.

Skelton, MH. "Program Controlled Paging Scheme for Memory Expansion," IP.com. IPCOM000050954D, 1982.

Slegel et al. "IBM's S/390 G5 Microprocessor Design," IEEE Micro, 1999, pp. 12-23.

Smith, BA. "Chip Select Decoder Circuit," IP.com, IPCOM000063400D, 1985.

Stelzer, KC. "Planar Memory Boundary Registers with Remap Feature," IMB Technical Disclosure Bulletin, 1993.

Sunaga et al. "An Enable Signal Circuit for Multiple Small Banks," IP.com, IPCOM000015887D, 2002.

Sunaga et al. "Continuou RAS Access Method in Multiple-bank DRAM Chip," IP.com, IPCOM000123375D, 1998.

Toal et al. "A 32-Bit SoPC Implementation of a P5." Proceedings of the Eighth IEEE International Symposium on Computers and Communications, 2003, pp. 1530-1346.

Tudruj, Marek. "Dynamically reconfigurable heterogenous multi-processor systems with transputer-controlled communication," Journal of Systems Architecture, vol. 43, 1997, pp. 27-32.

Yao, YL. High Density Memory Selection Circuit,: IP.com, IPCOM000078218D, 1972.

*Google, Inc. v. Netlist, Inc.*, No. 4:08-cv-04144-SBA, Netlist Inc.'s Answer to Complaint and Counterclaim (N.D. Ca. Filed Nov. 18, 2008).

*Google, Inc. v. Netlist, Inc.*, No. C 08-04144 SBA Google Inc.'s Invalidity Contentions Pursuant to PAT. L.F. 3-3, dated Apr. 13, 2009.

*Google, Inc. v. Netlist, Inc.*, No. C08 04144, Complaint for Declaratory Relief, (N.D. Ca Dated Aug. 29, 2008).

Letter from G. Hopkins Guy III, Orrick, Herrington & Sutcliffe LLP, to R. Scott Oliver, Morrison & Foerster, (Apr. 14, 2009).

*MetaRAM, Inc. v. Netlist, Inc*. No. 3:09-cv-01309-VRW, MetaRam's Reply to Netlist's Counterclaims, (N.D. Ca. Filed Jun. 3, 2009).

*MetaRam, Inc. v. Netlist, Inc.* No. 3:09-cv-01309-VRW, Netlist's Answer to Complaint and Counterclaims, (N.D. CA, filed May 11, 2009).

*MetaRAM, Inc. v. Netlist, Inc.*, No. C09 01309, Complaint for Patent Infringement, (N.D. Ca. Filed Mar. 25, 2009).

*Netlist, Inc. v. MetaRam, Inc.*, No. 09-165-GMS, MetaRAM, Inc.'s Answer and Affirmative Defenses to Plaintiff's Complaint, dated Apr. 20, 2009.

*Netlist, Inc. v. MetaRAM, Inc.*, No. 1:09-ccv-00165-GMS, Complaint for Patent Infringement, (D. Del. Field Mar. 12, 2009).

Miles J. Murdocca et al., "Principles of Computer Architecture", Prentice Hall, 2000, pp. 249-251.

"64 & 72 Pin Zip/Simm Sram Module", JEDEC, Standard No. 21-C, www.jedec.com/download/search/4_04_01.pdf, Jun. 1997 pp. 4.4.1-1.

"PC2100 and PC1600 DDR SDRAM Registered DIMM Design Specification" JEDEC, Standard No. 21-C, Revision 1-3, Jan. 2002, pp. 4.20.4-1.

\* cited by examiner

MEMORY MODULE DECODER

CROSS-REFERENCE TO RELATED APPLICATIONS

The present application is a continuation of U.S. patent application Ser. No. 11/173,175, filed Jul. 1, 2005, now U.S. Pat. No. 7,289,386 incorporated in its entirety by reference herein, which claims the benefit of U.S. Provisional Application No. 60/588,244, filed Jul. 15, 2004, incorporated in its entirety by reference herein, and which is a continuation-in-part of U.S. patent application Ser. No. 11/075,395, filed Mar. 7, 2005 now U.S. Pat. No. 7,286,436, which claims the benefit of U.S. Provisional Application No. 60/550,668, filed Mar. 5, 2004 and U.S. Provisional Application No. 60/575,595, filed May 28, 2004.

BACKGROUND OF THE INVENTION

1. Field of the Invention

The present invention relates generally to memory modules of a computer system, and more specifically to devices and methods for improving the performance, the memory capacity, or both, of memory modules.

2. Description of the Related Art

Certain types of memory modules comprise a plurality of dynamic random-access memory (DRAM) devices mounted on a printed circuit board (PCB). These memory modules are typically mounted in a memory slot or socket of a computer system (e.g., a server system or a personal computer) and are accessed by the processor of the computer system. Memory modules typically have a memory configuration with a unique combination of rows, columns, and banks which result in a total memory capacity for the memory module.

For example, a 512-Megabyte memory module (termed a "512-MB" memory module, which actually has $2^{29}$ or 536,870,912 bytes of capacity) will typically utilize eight 512-Megabit DRAM devices (each identified as a "512-Mb" DRAM device, each actually having $2^{29}$ or 536,870,912 bits of capacity). The memory cells (or memory locations) of each 512-Mb DRAM device can be arranged in four banks, with each bank having an array of $2^{24}$ (or 16,777,216) memory locations arranged as $2^{13}$ rows and $2^{11}$ columns, and with each memory location having a width of 8 bits. Such DRAM devices with 64 M 8-bit-wide memory locations (actually with four banks of $2^{27}$ or 134,217,728 one-bit memory cells arranged to provide a total of $2^{26}$ or 67,108,864 memory locations with 8 bits each) are identified as having a "64 Mb×8" or "64 M×8-bit" configuration, or as having a depth of 64 M and a bit width of 8. Furthermore, certain commercially-available 512-MB memory modules are termed to have a "64 M×8-byte" configuration or a "64 M×64-bit" configuration with a depth of 64 M and a width of 8 bytes or 64 bits.

Similarly, a 1-Gigabyte memory module (termed a "1-GB" memory module, which actually has 230 or 1,073,741,824 bytes of capacity) can utilize eight 1-Gigabit DRAM devices (each identified as a "1-Gb" DRAM device, each actually having 230 or 1,073,741,824 bits of capacity). The memory locations of each 1-Gb DRAM device can be arranged in four banks, with each bank having an array of memory locations with $2^{14}$ rows and $2^{11}$ columns, and with each memory location having a width of 8 bits. Such DRAM devices with 128 M 8-bit-wide memory locations (actually with a total of $2^{27}$ or 134,217,728 memory locations with 8 bits each) are identified as having a "128 Mb×8" or "128 M×8-bit" configuration, or as having a depth of 128 M and a bit width of 8. Furthermore, certain commercially-available 1-GB memory modules are identified as having a "128 M×8-byte" configuration or a "128 M×64-bit" configuration with a depth of 128 M and a width of 8 bytes or 64 bits.

The commercially-available 512-MB (64 M×8-byte) memory modules and the 1-GB (128 M×8-byte) memory modules described above are typically used in computer systems (e.g., personal computers) which perform graphics applications since such "×8" configurations are compatible with data mask capabilities often used in such graphics applications. Conversely, memory modules with "×4" configurations are typically used in computer systems such as servers which are not as graphics-intensive. Examples of such commercially available "×4" memory modules include, but are not limited to, 512-MB (128 M×4-byte) memory modules comprising eight 512-Mb (128 Mb×4) memory devices.

The DRAM devices of a memory module are generally arranged as ranks or rows of memory, each rank of memory generally having a bit width. For example, a memory module in which each rank of the memory module is 64 bits wide is described as having an "×64" organization. Similarly, a memory module having 72-bit-wide ranks is described as having an "×72" organization.

The memory capacity of a memory module increases with the number of memory devices. The number of memory devices of a memory module can be increased by increasing the number of memory devices per rank or by increasing the number of ranks. For example, a memory module with four ranks has double the memory capacity of a memory module with two ranks and four times the memory capacity of a memory module with one rank. Rather than referring to the memory capacity of the memory module, in certain circumstances, the memory density of the memory module is referred to instead.

During operation, the ranks of a memory module are selected or activated by control signals that are received from the processor. Examples of such control signals include, but are not limited to, rank-select signals, also called chip-select signals. Most computer and server systems support one-rank and two-rank memory modules. By only supporting one-rank and two-rank memory modules, the memory density that can be incorporated in each memory slot is limited.

SUMMARY OF THE INVENTION

In certain embodiments, a memory module is connectable to a computer system. The memory module comprises a printed circuit board, a plurality of memory devices coupled to the printed circuit board, and a logic element coupled to the printed circuit board. The plurality of memory devices has a first number of memory devices. The logic element receives a set of input control signals from the computer system. The set of input control signals corresponds to a second number of memory devices smaller than the first number of memory devices. The logic element generates a set of output control signals in response to the set of input control signals. The set of output control signals corresponds to the first number of memory devices.

In certain embodiments, a method utilizes a memory module in a computer system. The method comprises coupling the memory module to the computer system. The memory module comprises a plurality of memory devices arranged in a first number of ranks. The method further comprises inputting a first set of control signals to the memory module. The first set of control signals corresponds to a second number of ranks smaller than the first number of ranks. The method further comprises generating a second set of control signals in response to the first set of control signals. The second set of control signals corresponds to the first number of ranks.

In certain embodiments, a memory module is connectable to a computer system. The memory module comprises a plurality of memory devices arranged in a first number of ranks. The memory module comprises means for coupling the memory module to the computer system. The memory module further comprises means for inputting a first set of control signals to the memory module. The first set of control signals corresponds to a second number of ranks smaller than the first number of ranks. The memory module further comprises means for generating a second set of control signals in response to the first set of control signals. The second set of control signals corresponds to the first number of ranks.

In certain embodiments, a memory module is connectable to a computer system. The memory module comprises a first memory device having a first data signal line and a first data strobe signal line. The memory module further comprises a second memory device having a second data signal line and a second data strobe signal line. The memory module further comprises a common data signal line connectable to the computer system. The memory module further comprises an isolation device electrically coupled to the first data signal line, to the second data signal line, and to the common data signal line. The isolation device selectively alternates between electrically coupling the first data signal line to the common data signal line and electrically coupling the second data signal line to the common data signal line.

DETAILED DESCRIPTION OF EXEMPLARY EMBODIMENTS

Most high-density memory modules are currently built with 512-Megabit ("512-Mb") memory devices wherein each memory device has a 64 M×8-bit configuration. For example, a 1-Gigabyte ("1-GB") memory module with error checking capabilities can be fabricated using eighteen such 512-Mb memory devices. Alternatively, it can be economically advantageous to fabricate a 1-GB memory module using lower-density memory devices and doubling the number of memory devices used to produce the desired word width. For example, by fabricating a 1-GB memory module using thirty-six 256-Mb memory devices with 64 M×4-bit configuration, the cost of the resulting 1-GB memory module can be reduced since the unit cost of each 256-Mb memory device is typically lower than one-half the unit cost of each 512-Mb memory device. The cost savings can be significant, even though twice as many 256-Mb memory devices are used in place of the 512-Mb memory devices.

Market pricing factors for DRAM devices are such that higher-density DRAM devices (e.g., 1-Gb DRAM devices) are much more than twice the price of lower-density DRAM devices (e.g., 512-Mb DRAM devices). In other words, the price per bit ratio of the higher-density DRAM devices is greater than that of the lower-density DRAM devices. This pricing difference often lasts for months or even years after the introduction of the higher-density DRAM devices, until volume production factors reduce the costs of the newer higher-density DRAM devices. Thus, when the cost of a higher-density DRAM device is more than the cost of two lower-density DRAM devices, there is an economic incentive for utilizing pairs of the lower-density DRAM devices to replace individual higher-density DRAM devices.

Figure 1A:
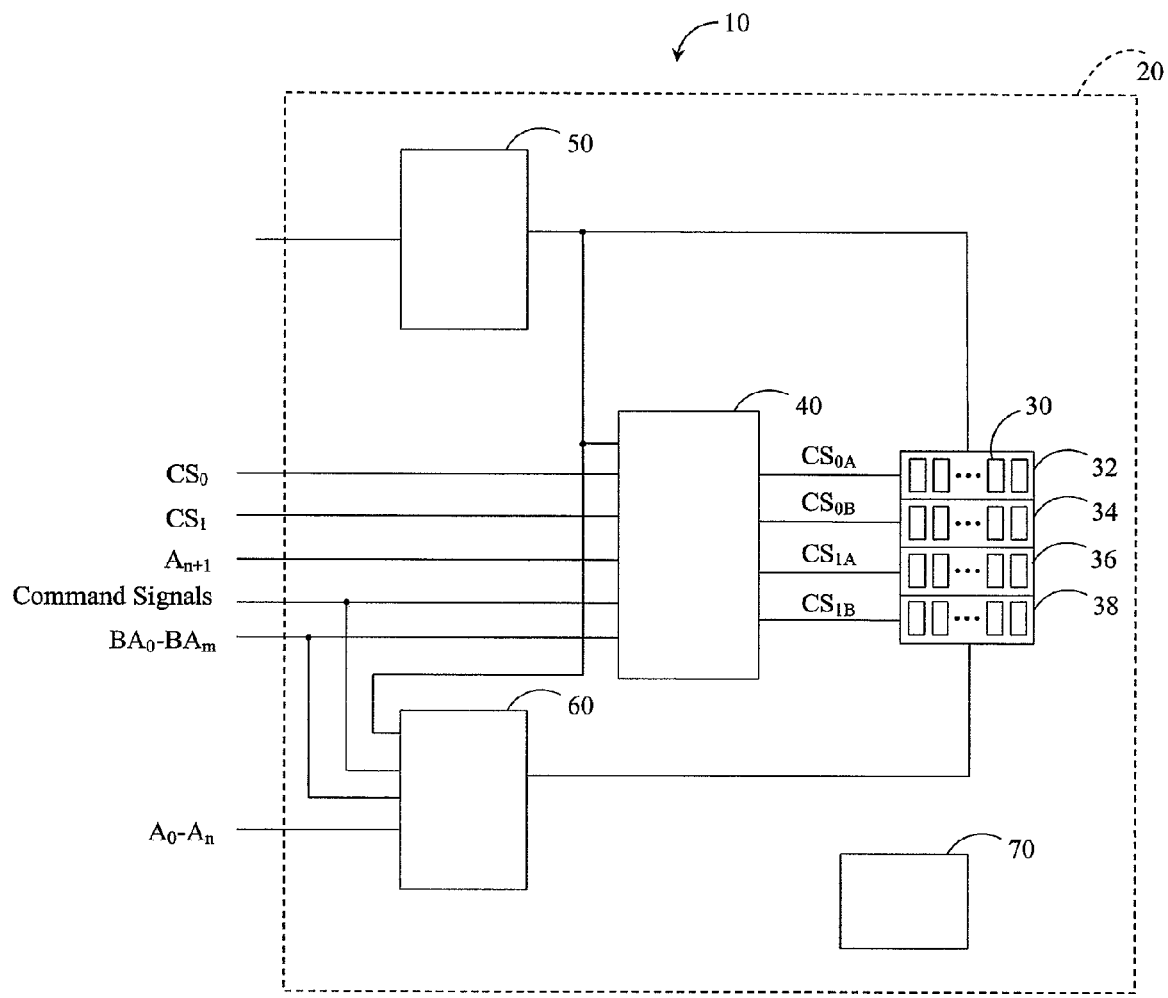
FIG. 1A schematically illustrates an exemplary memory module with four ranks of memory devices compatible with certain embodiments described herein.

FIG. 1A schematically illustrates an exemplary memory module 10 compatible with certain embodiments described herein. The memory module 10 is connectable to a computer system (not shown). The memory module 10 comprises a printed circuit board 20 and a plurality of memory devices 30 coupled to the printed circuit board 20. The plurality of memory devices 30 has a first number of memory devices. The memory module 10 further comprises a logic element 40 coupled to the printed circuit board 20. The logic element 40 receives a set of input control signals from the computer system. The set of input control signals correspond to a second number of memory devices smaller than the first number of memory devices. The logic element 40 generates a set of output control signals in response to the set of input control signals. The set of output control signals corresponds to the first number of memory devices.

In certain embodiments, as schematically illustrated in FIG. 1A, the memory module 10 further comprises a phase-lock loop device 50 coupled to the printed circuit board 20 and a register 60 coupled to the printed circuit board 20. In certain embodiments, the phase-lock loop device 50 and the register 60 are each mounted on the printed circuit board 20. In response to signals received from the computer system, the phase-lock loop device 50 transmits clock signals to the plurality of memory devices 30, the logic element 40, and the register 60. The register 60 receives and buffers a plurality of control signals, including address signals (e.g., bank address signals, row address signals, column address signals, gated column address strobe signals, chip-select signals), and transmits corresponding signals to the appropriate memory devices 30. In certain embodiments, the register 60 comprises a plurality of register devices. While the phase-lock loop device 50, the register 60, and the logic element 40 are described herein in certain embodiments as being separate components, in certain other embodiments, two or more of the phase-lock loop device 50, the register 60, and the logic element 40 are portions of a single component. Persons skilled in the art are able to select a phase-lock loop device 50 and a register 60 compatible with embodiments described herein.

In certain embodiments, the memory module 10 further comprises electrical components which are electrically coupled to one another and are surface-mounted or embedded on the printed circuit board 20. These electrical components can include, but are not limited to, electrical conduits, resistors, capacitors, inductors, and transistors. In certain embodiments, at least some of these electrical components are discrete, while in other certain embodiments, at least some of these electrical components are constituents of one or more integrated circuits.

Various types of memory modules 10 are compatible with embodiments described herein. For example, memory modules 10 having memory capacities of 512-MB, 1-GB, 2-GB, 4-GB, 8-GB, as well as other capacities, are compatible with embodiments described herein. In addition, memory modules 10 having widths of 4 bytes, 8 bytes, 16 bytes, 32 bytes, or 32 bits, 64 bits, 128 bits, 256 bits, as well as other widths (in bytes or in bits), are compatible with embodiments described herein. Furthermore, memory modules 10 compatible with embodiments described herein include, but are not limited to, single in-line memory modules (SIMMs), dual in-line memory modules (DIMMs), small-outline DIMMs (SO-DIMMs), unbuffered DIMMs (UDIMMs), registered DIMMs (RDIMMs), fully-buffered DIMM (FBDIMM), mini-DIMMs, and micro-DIMMs.

In certain embodiments, the printed circuit board 20 is mountable in a module slot of the computer system. The printed circuit board 20 of certain such embodiments has a plurality of edge connections electrically coupled to corresponding contacts of the module slot and to the various components of the memory module 10, thereby providing electrical connections between the computer system and the components of the memory module 10.

Memory devices 30 compatible with embodiments described herein include, but are not limited to, random-access memory (RAM), dynamic random-access memory (DRAM), synchronous DRAM (SDRAM), and double-data-rate DRAM (e.g., DDR-1, DDR-2, DDR-3). In addition, memory devices 30 having bit widths of 4, 8, 16, 32, as well as other bit widths, are compatible with embodiments described herein. Memory devices 30 compatible with embodiments described herein have packaging which include, but are not limited to, thin small-outline package (TSOP), ball-grid-array (BGA), fine-pitch BGA (FBGA), micro-BGA (μBGA), mini-BGA (mBGA), and chip-scale packaging (CSP). Memory devices 30 compatible with embodiments described herein are available from a number of sources, including but not limited to, Samsung Semiconductor, Inc. of San Jose, Calif., Infineon Technologies AG of San Jose, Calif., and Micron Technology, Inc. of Boise, Id. Persons skilled in the art can select appropriate memory devices 30 in accordance with certain embodiments described herein.

Figure 1B:
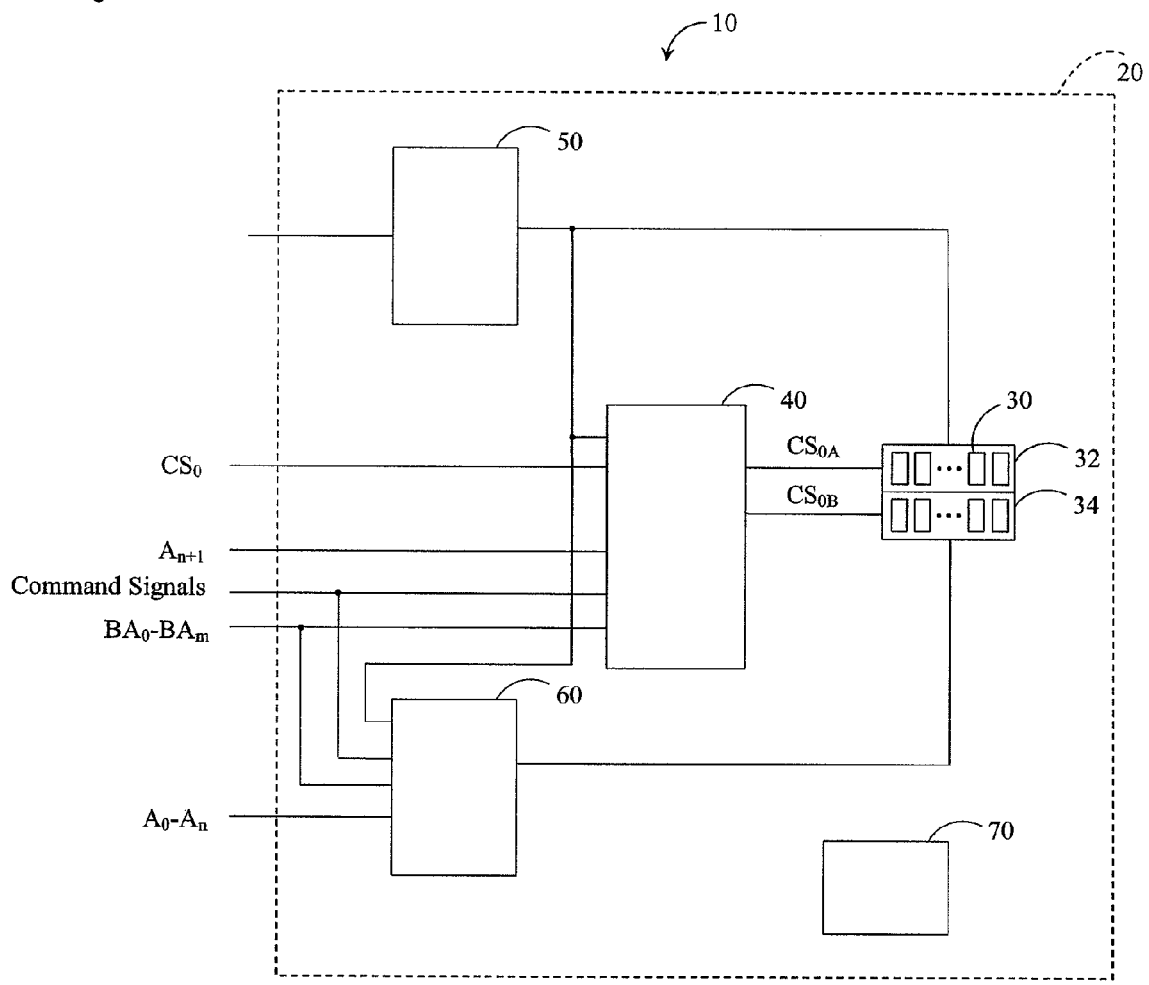
FIG. 1B schematically illustrates an exemplary memory module with two ranks of memory devices compatible with certain embodiments described herein.

In certain embodiments, the plurality of memory devices 30 are arranged in a first number of ranks. For example, in certain embodiments, the memory devices 30 are arranged in four ranks, as schematically illustrated by FIG. 1A. In other embodiments, the memory devices 30 are arranged in two ranks, as schematically illustrated by FIG. 1B. Other numbers of ranks of the memory devices 30 are also compatible with embodiments described herein.

In certain embodiments, the logic element 40 comprises a programmable-logic device (PLD), an application-specific integrated circuit (ASIC), a field-programmable gate array (FPGA), a custom-designed semiconductor device, or a complex programmable-logic device (CPLD). In certain embodiments, the logic element 40 is a custom device. Sources of logic elements 40 compatible with embodiments described herein include, but are not limited to, Lattice Semiconductor Corporation of Hillsboro, Oreg., Altera Corporation of San Jose, Calif., and Xilinx Incorporated of San Jose, Calif. In certain embodiments, the logic element 40 comprises various discrete electrical elements, while in certain other embodiments, the logic element 40 comprises one or more integrated circuits. Persons skilled in the art can select an appropriate logic element 40 in accordance with certain embodiments described herein.

As schematically illustrated by FIGS. 1A and 1B, in certain embodiments, the logic element 40 receives a set of input control signals, which includes address signals (e.g., bank address signals, row address signals, column address signals, gated column address strobe signals, chip-select signals) and command signals (e.g., refresh, precharge) from the computer system. In response to the set of input control signals, the logic element 40 generates a set of output control signals which includes address signals and command signals.

In certain embodiments, the set of output control signals corresponds to a first number of ranks in which the plurality of memory devices 30 of the memory module 10 are arranged, and the set of input control signals corresponds to a second number of ranks per memory module for which the computer system is configured. The second number of ranks in certain embodiments is smaller than the first number of ranks. For example, in the exemplary embodiment as schematically illustrated by FIG. 1A, the first number of ranks is four while the second number of ranks is two. In the exemplary embodiment of FIG. 1B, the first number of ranks is two while the second number of ranks is one. Thus, in certain embodiments, even though the memory module 10 actually has the first number of ranks of memory devices 30, the memory module 10 simulates a virtual memory module by operating as having the second number of ranks of memory devices 30. In certain embodiments, the memory module 10 simulates a virtual memory module when the number of memory devices 30 of the memory module 10 is larger than the number of memory devices 30 per memory module for which the computer system is configured to utilize.

In certain embodiments, the computer system is configured for a number of ranks per memory module which is smaller than the number of ranks in which the memory devices 30 of the memory module 10 are arranged. In certain such embodiments, the computer system is configured for two ranks of memory per memory module (providing two chip-select signals $CS_0$, $CS_1$) and the plurality of memory modules 30 of the memory module 10 are arranged in four ranks, as schematically illustrated by FIG. 1A. In certain other such embodiments, the computer system is configured for one rank of memory per memory module (providing one chip-select signal $CS_0$) and the plurality of memory modules 30 of the memory module 10 are arranged in two ranks, as schematically illustrated by FIG. 1B.

In the exemplary embodiment schematically illustrated by FIG. 1A, the memory module 10 has four ranks of memory devices 30 and the computer system is configured for two ranks of memory devices per memory module. The memory module 10 receives row/column address signals or signal bits ($A_0$-$A_{n+1}$), bank address signals ($BA_0$-$BA_m$), chip-select signals ($CS_0$ and $CS_1$), and command signals (e.g., refresh, precharge, etc.) from the computer system. The $A_0$-$A_n$ row/column address signals are received by the register 60, which buffers these address signals and sends these address signals to the appropriate ranks of memory devices 30. The logic element 40 receives the two chip-select signals ($CS_0$, $CS_1$) and one row/column address signal ($A_{n+1}$) from the computer system. Both the logic element 40 and the register 60 receive the bank address signals ($BA_0$-$BA_m$) and at least one command signal (e.g., refresh, precharge, etc.) from the computer system.

Logic Tables

Table 1 provides a logic table compatible with certain embodiments described herein for the selection among ranks of memory devices 30 using chip-select signals.

TABLE 1

| State | $CS_0$ | $CS_1$ | $A_{n+1}$ | Command | $CS_{0A}$ | $CS_{0B}$ | $CS_{1A}$ | $CS_{1B}$ |
|---|---|---|---|---|---|---|---|---|
| 1 | 0 | 1 | 0 | Active | 0 | 1 | 1 | 1 |
| 2 | 0 | 1 | 1 | Active | 1 | 0 | 1 | 1 |
| 3 | 0 | 1 | x | Active | 0 | 0 | 1 | 1 |
| 4 | 1 | 0 | 0 | Active | 1 | 1 | 0 | 1 |

TABLE 1-continued

| State | $CS_0$ | $CS_1$ | $A_{n+1}$ | Command | $CS_{0A}$ | $CS_{0B}$ | $CS_{1A}$ | $CS_{1B}$ |
|---|---|---|---|---|---|---|---|---|
| 5 | 1 | 0 | 1 | Active | 1 | 1 | 1 | 0 |
| 6 | 1 | 0 | x | Active | 1 | 1 | 0 | 0 |
| 7 | 1 | 1 | x | x | 1 | 1 | 1 | 1 |

Note:
1. $CS_0$, $CS_1$, $CS_{0A}$, $CS_{0B}$, $CS_{1A}$, and $CS_{1B}$ are active low signals.
2. $A_{n+1}$ is an active high signal.
3. 'x' is a Don't Care condition.
4. Command involves a number of command signals that define operations such as refresh, precharge, and other operations.

In Logic State 1: $CS_0$ is active low, $A_{n+1}$, is non-active, and Command is active. $CS_{0A}$ is pulled low, thereby selecting Rank 0.

In Logic State 2: $CS_0$ is active low, $A_{n+1}$ is active, and Command is active. $CS_{0B}$ is pulled low, thereby selecting Rank 1.

In Logic State 3: $CS_0$ is active low, $A_{n+1}$ is Don't Care, and Command is active high. $CS_{0A}$ and $CS_{0B}$ are pulled low, thereby selecting Ranks 0 and 1.

In Logic State 4: $CS_1$ is active low, $A_{n+1}$, is non-active, and Command is active. $CS_{1A}$ is pulled low, thereby selecting Rank 2.

In Logic State 5: $CS_1$ is active low, $A_{n+1}$, is active, and Command is active. $CS_{1B}$ is pulled low, thereby selecting Rank 3.

In Logic State 6: $CS_1$ is active low, $A_{n+1}$, is Don't Care, and Command is active. $CS_{1A}$ and $CS_{1B}$ are pulled low, thereby selecting Ranks 2 and 3.

In Logic State 7: $CS_0$ and $CS_1$ are pulled non-active high, which deselects all ranks, i.e., $CS_{0A}$, $CS_{0B}$, $CS_{1A}$, and $CS_{1B}$ are pulled high.

The "Command" column of Table 1 represents the various commands that a memory device (e.g., a DRAM device) can execute, examples of which include, but are not limited to, activation, read, write, precharge, and refresh. In certain embodiments, the command signal is passed through to the selected rank only (e.g., state 4 of Table 1). In such embodiments, the command signal (e.g., read) is sent to only one memory device or the other memory device so that data is supplied from one memory device at a time. In other embodiments, the command signal is passed through to both associated ranks (e.g., state 6 of Table 1). In such embodiments, the command signal (e.g., refresh) is sent to both memory devices to ensure that the memory content of the memory devices remains valid over time. Certain embodiments utilize a logic table such as that of Table 1 to simulate a single memory device from two memory devices by selecting two ranks concurrently.

Table 2 provides a logic table compatible with certain embodiments described herein for the selection among ranks of memory devices 30 using gated CAS signals.

TABLE 2

| CS* | RAS* | CAS* | WE* | Density Bit | A₁₀ | Command | CAS0* | CAS1* |
|---|---|---|---|---|---|---|---|---|
| 1 | x | x | x | x | x | NOP | x | x |
| 0 | 1 | 1 | 1 | x | x | NOP | 1 | 1 |
| 0 | 0 | 1 | 1 | 0 | x | ACTIVATE | 1 | 1 |
| 0 | 0 | 1 | 1 | 1 | x | ACTIVATE | 1 | 1 |
| 0 | 1 | 0 | 1 | 0 | x | READ | 0 | 1 |
| 0 | 1 | 0 | 1 | 1 | x | READ | 1 | 0 |
| 0 | 1 | 0 | 0 | 0 | x | WRITE | 0 | 1 |
| 0 | 1 | 0 | 0 | 1 | x | WRITE | 1 | 0 |
| 0 | 0 | 1 | 0 | 0 | 0 | PRECHARGE | 1 | 1 |
| 0 | 0 | 1 | 0 | 1 | 0 | PRECHARGE | 1 | 1 |
| 0 | 0 | 1 | 0 | x | 1 | PRECHARGE | 1 | 1 |
| 0 | 0 | 0 | 0 | x | x | MODE REG SET | 0 | 0 |
| 0 | 0 | 0 | 1 | x | x | REFRESH | 0 | 0 |

In certain embodiments in which the density bit is a row address bit, for read/write commands, the density bit is the value latched during the activate command for the selected bank.

Serial-Presence-Detect Device

Memory modules typically include a serial-presence detect (SPD) device 70 (e.g., an electrically-erasable-programmable read-only memory or EEPROM device) comprising data which characterize various attributes of the memory module, including but not limited to, the number of row addresses the number of column addresses, the data width of the memory devices, the number of ranks, the memory density per rank, the number of memory devices, and the memory density per memory device. The SPD device 70 communicates this data to the basic input/output system (BIOS) of the computer system so that the computer system is informed of the memory capacity and the memory configuration available for use and can configure the memory controller properly for maximum reliability and performance.

For example, for a commercially-available 512-MB (64 M×8-byte) memory module utilizing eight 512-Mb memory devices each with a 64 M×8-bit configuration, the SPD device contains the following SPD data (in appropriate bit fields of these bytes):

Byte 3: Defines the number of row address bits in the DRAM device in the memory module [13 for the 512-Mb memory device].

Byte 4: Defines the number of column address bits in the DRAM device in the memory module [11 for the 512-Mb memory device].

Byte 13: Defines the bit width of the primary DRAM device used in the memory module [8 bits for the 512-Mb (64 M×8-bit) memory device].

Byte 14: Defines the bit width of the error checking DRAM device used in the memory module [8 bits for the 512-Mb (64 M×8-bit) memory device].

Byte 17: Defines the number of banks internal to the DRAM device used in the memory module [4 for the 512-Mb memory device].

In a further example, for a commercially-available 1-GB (128 M×8-byte) memory module utilizing eight 1-Gb memory devices each with a 128 M×8-bit configuration, as described above, the SPD device contains the following SPD data (in appropriate bit fields of these bytes):

Byte 3: Defines the number of row address bits in the DRAM device in the memory module [14 for the 1-Gb memory device].

Byte 4: Defines the number of column address bits in the DRAM device in the memory module [11 for the 1-Gb memory device].

Byte 13: Defines the bit width of the primary DRAM device used in the memory module [8 bits for the 1-Gb (128 M×8-bit) memory device].

Byte 14: Defines the bit width of the error checking DRAM device used in the memory module [8 bits for the 1-Gb (128 M×8-bit) memory device].

Byte 17: Defines the number of banks internal to the DRAM device used in the memory module [4 for the 1-Gb memory device].

In certain embodiments, the SPD device 70 comprises data which characterize the memory module 10 as having fewer ranks of memory devices than the memory module 10 actually has, with each of these ranks having more memory density. For example, for a memory module 10 compatible with certain embodiments described herein having two ranks of memory devices 30, the SPD device 70 comprises data which characterizes the memory module 10 as having one rank of memory devices with twice the memory density per rank. Similarly, for a memory module 10 compatible with certain embodiments described herein having four ranks of memory devices 30, the SPD device 70 comprises data which characterizes the memory module 10 as having two ranks of memory devices with twice the memory density per rank. In addition, in certain embodiments, the SPD device 70 comprises data which characterize the memory module 10 as having fewer memory devices than the memory module 10 actually has, with each of these memory devices having more memory density per memory device. For example, for a memory module 10 compatible with certain embodiments described herein, the SPD device 70 comprises data which characterizes the memory module 10 as having one-half the number of memory devices that the memory module 10 actually has, with each of these memory devices having twice the memory density per memory device.

Figure 1C:
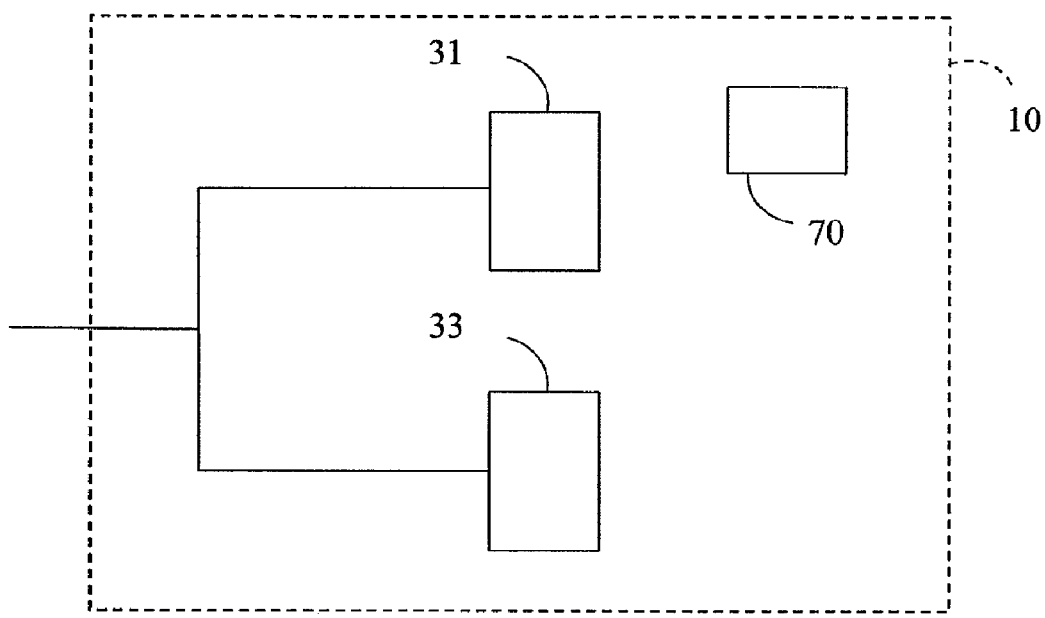
FIG. 1C schematically illustrates another exemplary memory module in accordance with certain embodiments described herein.

FIG. 1C schematically illustrates an exemplary memory module 10 in accordance with certain embodiments described herein. The memory module 10 comprises a pair of substantially identical memory devices 31, 33. Each memory device 31, 33 has a first bit width, a first number of banks of memory locations, a first number of rows of memory locations, and a first number of columns of memory locations. The memory module 10 further comprises an SPD device 70 comprising data that characterizes the pair of memory devices 31, 33. The data characterize the pair of memory devices 31, 33 as a virtual memory device having a second bit width equal to twice the first bit width, a second number of banks of memory locations equal to the first number of banks, a second number of rows of memory locations equal to the first number of rows, and a second number of columns of memory locations equal to the first number of columns.

In certain such embodiments, the SPD device 70 of the memory module 10 is programmed to describe the combined pair of lower-density memory devices 31, 33 as one virtual or pseudo-higher-density memory device. In an exemplary embodiment, two 512-Mb memory devices, each with a 128 M×4-bit configuration, are used to simulate one 1-Gb memory device having a 128 M×8-bit configuration. The SPD device 70 of the memory module 10 is programmed to describe the pair of 512-Mb memory devices as one virtual or pseudo-1-Gb memory device.

For example, to fabricate a 1-GB (128 M×8-byte) memory module, sixteen 512-Mb (128 M×4-bit) memory devices can be used. The sixteen 512-Mb (128 M×4-bit) memory devices are combined in eight pairs, with each pair serving as a virtual or pseudo-1-Gb (128 M×8-bit) memory device. In certain such embodiments, the SPD device 70 contains the following SPD data (in appropriate bit fields of these bytes):

Byte 3: 13 row address bits.
Byte 4: 12 column address bits.
Byte 13: 8 bits wide for the primary virtual 1-Gb (128 M×8-bit) memory device.
Byte 14: 8 bits wide for the error checking virtual 1-Gb (128 M×8-bit) memory device.
Byte 17: 4 banks.

In this exemplary embodiment, bytes 3, 4, and 17 are programmed to have the same values as they would have for a 512-MB (128 M×4-byte) memory module utilizing 512-Mb (128 M×4-bit) memory devices. However, bytes 13 and 14 of the SPD data are programmed to be equal to 8, corresponding to the bit width of the virtual or pseudo-higher-density 1-Gb (128 M×8-bit) memory device, for a total capacity of 1-GB. Thus, the SPD data does not describe the actual-lower-density memory devices, but instead describes the virtual or pseudo-higher-density memory devices. The BIOS accesses the SPD data and recognizes the memory module as having 4 banks of memory locations arranged in $2^{13}$ rows and $2^{12}$ columns, with each memory location having a width of 8 bits rather than 4 bits.

In certain embodiments, when such a memory module 10 is inserted in a computer system, the computer system's memory controller then provides to the memory module 10 a set of input control signals which correspond to the number of ranks or the number of memory devices reported by the SPD device 70. For example, placing a two-rank memory module 10 compatible with certain embodiments described herein in a computer system compatible with one-rank memory modules, the SPD device 70 reports to the computer system that the memory module 10 only has one rank. The logic element 40 then receives a set of input control signals corresponding to a single rank from the computer system's memory controller, and generates and transmits a set of output control signals corresponding to two ranks to the appropriate memory devices 30 of the memory module 10. Similarly, when a two-rank memory module 10 compatible with certain embodiments described herein is placed in a computer system compatible with either one- or two-rank memory modules, the SPD device 70 reports to the computer system that the memory module 10 only has one rank. The logic element 40 then receives a set of input control signals corresponding to a single rank from the computer system's memory controller, and generates and transmits a set of output control signals corresponding to two ranks to the appropriate memory devices 30 of the memory module 10. Furthermore, a four-rank memory module 10 compatible with certain embodiments described herein simulates a two-rank memory module whether the memory module 10 is inserted in a computer system compatible with two-rank memory modules or with two- or four-rank memory modules. Thus, by placing a four-rank memory module 10 compatible with certain embodiments described herein in a module slot that is four-rank-ready, the computer system provides four chip-select signals, but the memory module 10 only uses two of the chip-select signals.

Memory Density Multiplication

In certain embodiments, two memory devices having a memory density are used to simulate a single memory device having twice the memory density, and an additional address signal bit is used to access the additional memory. Similarly, in certain embodiments, two ranks of memory devices having a memory density are used to simulate a single rank of memory devices having twice the memory density, and an additional address signal bit is used to access the additional memory. As used herein, such simulations of memory devices or ranks of memory devices are termed as "memory density multiplication," and the term "density transition bit" is used to refer to the additional address signal bit which is used to access the additional memory.

In certain embodiments utilizing memory density multiplication embodiments, the memory module 10 can have various types of memory devices 30 (e.g., DDR1, DDR2, DDR3, and beyond). The logic element 40 of certain such embodiments utilizes implied translation logic equations having variations depending on whether the density transition bit is a row, column, or internal bank address bit. In addition, the translation logic equations of certain embodiments vary depending on the type of memory module 10 (e.g., UDIMM, RDIMM, FBDIMM, etc.). Furthermore, in certain embodiments, the translation logic equations vary depending on whether the implementation multiplies memory devices per rank or multiplies the number of ranks per memory module.

Table 3A provides the numbers of rows and columns for DDR-1 memory devices, as specified by JEDEC standard JESD79D, "Double Data Rate (DDR) SDRAM Specification," published February 2004, and incorporated in its entirety by reference herein.

TABLE 3A

|  | 128-Mb | 256-Mb | 512-Mb | 1-Gb |
| --- | --- | --- | --- | --- |
| Number of banks | 4 | 4 | 4 | 4 |
| Number of row address bits | 12 | 13 | 13 | 14 |
| Number of column address bits for "× 4" configuration | 11 | 11 | 12 | 12 |
| Number of column address bits for "× 8" configuration | 10 | 10 | 11 | 11 |
| Number of column address bits for "× 16" configuration | 9 | 9 | 10 | 10 |

As described by Table 3A, 512-Mb (128 M×4-bit) DRAM devices have $2^{13}$ rows and $2^{12}$ columns of memory locations, while 1-Gb (128 M×8-bit) DRAM devices have $2^{14}$ rows and $2^{11}$ columns of memory locations. Because of the differences in the number of rows and the number of columns for the two types of memory devices, complex address translation procedures and structures would typically be needed to fabricate a 1-GB (128 M×8-byte) memory module using sixteen 512-Mb (128 M×4-bit) DRAM devices.

Table 3B shows the device configurations as a function of memory density for DDR2 memory devices.

TABLE 3B

| | Number of Rows | Number of Columns | Number of Internal Banks | Page Size (x4s or x8s) |
|---|---|---|---|---|
| 256 Mb | 13 | 10 | 4 | 1 KB |
| 512 Mb | 14 | 10 | 4 | 1 KB |
| 1 Gb | 14 | 10 | 8 | 1 KB |
| 2 Gb | 15 | 10 | 8 | 1 KB |
| 4 Gb | to be determined | to be determined | 8 | 1 KB |

Table 4 lists the corresponding density transition bit for the density transitions between the DDR2 memory densities of Table 3B.

TABLE 4

| Density Transition | Density Transition Bit |
|---|---|
| 256 Mb to 512 Mb | $A_{13}$ |
| 512 Mb to 1 Gb | $BA_2$ |
| 1 Gb to 2 Gb | $A_{14}$ |
| 2 Gb to 4 Gb | to be determined |

Because the standard memory configuration of 4-Gb DDR2 SDRAM modules is not yet determined by the appropriate standards-setting organization, Tables 3B and 4 have "to be determined" in the appropriate table entries.

In certain embodiments, the logic translation equations are programmed in the logic element 40 by hardware, while in certain other embodiments, the logic translation equations are programmed in the logic element 40 by software. Examples 1 and 2 provide exemplary sections of Verilog code compatible with certain embodiments described herein. As described more fully below, the code of Examples 1 and 2 includes logic to reduce potential problems due to "back-to-back adjacent read commands which cross memory device boundaries or "BBARX." Persons skilled in the art are able to provide additional logic translation equations compatible with embodiments described herein.

An exemplary section of Verilog code compatible with memory density multiplication from 512 Mb to 1 Gb using DDR2 memory devices with the $BA_2$ density transition bit is listed below in Example 1. The exemplary code of Example 1 corresponds to a logic element 40 which receives one chip-select signal from the computer system and which generates two chip-select signals.

EXAMPLE 1

```
always @(posedge clk__in)
    begin
            rs0N__R <= rs0__in__N;     // cs0
            rasN__R <= ras__in__N;
            casN__R <= cas__in__N;
            weN__R <= we__in__N;
    end
// Gated Chip Selects
assign          pcs0a__1 = (~rs0__in__N & ~ras__in__N & ~cas__in__N)                       // ref,md reg set
                | (~rs0__in__N & ras__in__N & cas__in__N)                                   // ref exit, pwr dn
                | (~rs0__in__N & ~ras__in__N & cas__in__N & ~we__in__N & a10__in)          // pchg all
                | (~rs0__in__N & ~ras__in__N & cas__in__N & ~we__in__N & ~a10__in & ~ba2__in)// pchg single bnk
                | (~rs0__in__N & ~ras__in__N & cas__in__N & we__in__N     & ~ba2__in)      // activate
                | (~rs0__in__N & ras__in__N & ~cas__in__N          & ~ba2__in)             // xfr
                ;
assign          pcs0b__1 = (~rs0__in__N & ~ras__in__N & ~cas__in__N)                       // ref,md reg set
                | (~rs0__in__N & ras__in__N & cas__in__N)                                   // ref exit, pwr dn
                | (~rs0__in__N & ~ras__in__N & cas__in__N & ~we__in__N & a10__in)          // pchg all
                | (~rs0__in__N & ~ras__in__N & cas__in__N & ~we__in__N & ~a10__in & ba2__in)// pchg single bnk
                | (~rs0__in__N & ~ras__in__N & cas__in__N & we__in__N     & ba2__in)       // activate
                | (~rs0__in__N & ras__in__N & ~cas__in__N          & ba2__in) // xfr
                ;
//-----------------------------------
    always @(posedge clk__in)
        begin
            a4__r <= a4__in ;
            a5__r <= a5__in ;
            a6__r <= a6__in ;
            a10__r <= a10__in ;
            ba0__r <= ba0__in ;
            ba1__r <= ba1__in ;
            ba2__r <= ba2__in ;
            q__mrs__cmd__cyc1 <= q__mrs__cmd ;
        end
//////////////////////////////////////////////////////////
// determine the cas latency
//////////////////////////////////////////////////////////
assign q__mrs__cmd__r = (!rasN__R & !casN__R & !weN__R)
            & !rs0N__R
            & (!ba0__r & !ba1__r)
            ;                   // md reg set cmd
    always @(posedge clk__in)
        if (~reset__N)          // lmr
            cl3 <= 1'b1 ;
        else if (q__mrs__cmd__cyc1)     // load mode reg cmd
        begin
```

```
            cl3 <= (~a6_r & a5_r & a4_r );
    end
always @(posedge clk_in)
    if (~reset_N)              // reset
            cl2 <= 1'b0 ;
    else if (q_mrs_cmd_cyc1)   // load mode reg cmd
    begin
            cl2 <= (~a6_r & a5_r & ~a4_r );
    end
always @(posedge clk_in)
    if (~reset_N)              // reset
            cl4 <= 1'b0 ;
    else if (q_mrs_cmd_cyc1)   // load mode reg cmd
    begin
            cl4 <= (a6_r & ~a5_r & ~a4_r );
    end
always @(posedge clk_in)
    if (~reset_N)              cl5 <= 1'b0 ;
    else if (q_mrs_cmd_cyc1)   // load mode reg cmd
    begin
            cl5 <= (a6_r & ~a5_r & a4_r );
    end
assign              pre_cyc2_enfet = (wr_cmd_cyc1 & acs_cyc1 & cl3)     // wr brst cl3 preamble
                        ;
assign              pre_cyc3_enfet = (rd_cmd_cyc2 & cl3)                // rd brst cl3 preamble
                        | (wr_cmd_cyc2 & cl3)                           // wr brst cl3 1st pair
                        | (wr_cmd_cyc2 & cl4)                           // wr brst cl4 preamble
                        ;
assign              pre_cyc4_enfet = (wr_cmd_cyc3 & cl3)                // wr brst cl3 2nd pair
                        | (wr_cmd_cyc3 & cl4)                           // wr brst cl4 1st pair
                        | (rd_cmd_cyc3 & cl3)                           // rd brst cl3 1st pair
                        | (rd_cmd_cyc3 & cl4)                           // rd brst cl4 preamble
                        ;
assign              pre_cyc5_enfet = (rd_cmd_cyc4 & cl3)                // rd brst cl3 2nd pair
                        | (wr_cmd_cyc4 & cl4)                           // wr brst cl4 2nd pair
                        | (rd_cmd_cyc4 & cl4)                           // rd brst cl4 1st pair
                        ;
// dq
assign              pre_dq_cyc = pre_cyc2_enfet
                        | pre_cyc3_enfet
                        | pre_cyc4_enfet
                        | pre_cyc5_enfet
                        ;
assign              pre_dq_ncyc = enfet_cyc2
                        | enfet_cyc3
                        | enfet_cyc4
                        | enfet_cyc5
                        ;
// dqs
assign              pre_dqsa_cyc = (pre_cyc2_enfet & ~ba2_r)
                        | (pre_cyc3_enfet & ~ba2_cyc2)
                        | (pre_cyc4_enfet & ~ba2_cyc3)
                        | (pre_cyc5_enfet & ~ba2_cyc4)
                        ;
assign              pre_dqsb_cyc = (pre_cyc2_enfet & ba2_r)
                        | (pre_cyc3_enfet & ba2_cyc2)
                        | (pre_cyc4_enfet & ba2_cyc3)
                        | (pre_cyc5_enfet & ba2_cyc4)
                        ;
assign              pre_dqsa_ncyc = (enfet_cyc2 & ~ba2_cyc2)
                        | (enfet_cyc3 & ~ba2_cyc3)
                        | (enfet_cyc4 & ~ba2_cyc4)
                        | (enfet_cyc5 & ~ba2_cyc5)
                        ;
assign              pre_dqsb_ncyc = (enfet_cyc2 & ba2_cyc2)
                        | (enfet_cyc3 & ba2_cyc3)
                        | (enfet_cyc4 & ba2_cyc4)
                        | (enfet_cyc5 & ba2_cyc5)
                        ;
always @(posedge clk_in)
    begin
            acs_cyc2 <= acs_cyc1 ;         // cs active
            ba2_cyc2 <= ba2_r ;
            ba2_cyc3 <= ba2_cyc2 ;
            ba2_cyc4 <= ba2_cyc3 ;
            ba2_cyc5 <= ba2_cyc4 ;
            rd_cmd_cyc2 <= rd_cmd_cyc1 & acs_cyc1;
            rd_cmd_cyc3 <= rd_cmd_cyc2 ;
            rd_cmd_cyc4 <= rd_cmd_cyc3 ;
```

```
            rd_cmd_cyc5 <= rd_cmd_cyc4 ;
            rd_cmd_cyc6 <= rd_cmd_cyc5 ;
            rd_cmd_cyc7 <= rd_cmd_cyc6 ;
            wr_cmd_cyc2 <= wr_cmd_cyc1 & acs_cyc1;
            wr_cmd_cyc3 <= wr_cmd_cyc2 ;
            wr_cmd_cyc4 <= wr_cmd_cyc3 ;
            wr_cmd_cyc5 <= wr_cmd_cyc4 ;
    end
    always @(negedge clk_in)
        begin
            dq_ncyc <= dq_cyc;
            dqs_ncyc_a <= dqs_cyc_a;
            dqs_ncyc_b <= dqs_cyc_b;
        end
// DQ FET enables
assign          enq_fet1 = dq_cyc | dq_ncyc          ;
assign          enq_fet2 = dq_cyc | dq_ncyc ;
assign          enq_fet3 = dq_cyc | dq_ncyc          ;
assign          enq_fet4 = dq_cyc | dq_ncyc ;
assign          enq_fet5 = dq_cyc | dq_ncyc ;
// DQS FET enables
assign          ens_fet1a = dqs_cyc_a | dqs_ncyc_a ;
assign          ens_fet2a = dqs_cyc_a | dqs_ncyc_a ;
assign          ens_fet3a = dqs_cyc_a | dqs_ncyc_a ;
assign          ens_fet1b = dqs_cyc_b | dqs_ncyc_b ;
assign          ens_fet2b = dqs_cyc_b | dqs_ncyc_b ;
assign          ens_fet3b = dqs_cyc_b | dqs_ncyc_b ;
```

Another exemplary section of Verilog code compatible with memory density multiplication from 256 Mb to 512 Mb using DDR2 memory devices and gated CAS signals with the row $A_{13}$ density transition bit is listed below in Example 2. The exemplary code of Example 2 corresponds to a logic element 40 which receives one gated CAS signal from the computer system and which generates two gated CAS signals.

EXAMPLE 2

```
// latched a13 flags cs0, banks 0-3
    always @(posedge clk_in)
        if (actv_cmd_R & ~rs0N_R & ~bnk1_R & ~bnk0_R ) // activate
        begin
            l_a13_00 <= a13_r ;
        end
    always @(posedge clk_in)
        if (actv_cmd_R & ~rs0N_R & ~bnk1_R & bnk0_R)   // activate
        begin
            l_a13_01 <= a13_r ;
        end
    always @(posedge clk_in)
        if (actv_cmd_R & ~rs0N_R & bnk1_R & ~bnk0_R)   // activate
        begin
            l_a13_10 <= a13_r ;
        end
    always @(posedge clk_in)
        if (actv_cmd_R & ~rs0N_R & bnk1_R & bnk0_R)    // activate
        begin
            l_a13_11 <= a13_r ;
        end
// gated cas
assign cas_i = ~(casN_R);
assign cas0_o = ( ~rasN_R & cas_i)
            | ( rasN_R & ~l_a13_00 & ~bnk1_R & ~bnk0_R & cas_i)
            | ( rasN_R & ~l_a13_01 & ~bnk1_R & bnk0_R & cas_i)
            | ( rasN_R & ~l_a13_10 & bnk1_R & ~bnk0_R & cas_i)
            | ( rasN_R & ~l_a13_11 & bnk1_R & bnk0_R & cas_i)
            ;
assign cas1_o = ( ~rasN_R & cas_i)
            | ( rasN_R & l_a13_00 & ~bnk1_R & ~bnk0_R & cas_i)
```

-continued

```
            | ( rasN_R & 1_a13_01 & ~bnk1_R & bnk0_R & cas_i)
            | ( rasN_R & 1_a13_10 & bnk1_R & ~bnk0_R & cas_i)
            | ( rasN_R & 1_a13_11 & bnk1_R & bnk0_R & cas_i)
            ;
assign   pcas_0_N = ~cas0_o;
assign   pcas_1_N = ~cas1_o;
assign   rd0_o_R1 = rasN_R & cas0_o & weN_R & ~rs0N_R; // rnk0 rd cmd cyc
assign   rd1_o_R1 = rasN_R & cas1_o & weN_R & ~rs0N_R; // rnk1 rd cmd cyc
assign   wr0_o_R1 = rasN_R & cas0_o & ~weN_R & ~rs0N_R; // rnk0 wr cmd cyc
assign   wr1_o_R1 = rasN_R & cas1_o & ~weN_R & ~rs0N_R ; // rnk1 wr cmd cyc
  always @(posedge clk_in)
    begin
        rd0_o_R2 <= rd0_o_R1 ;
        rd0_o_R3 <= rd0_o_R2;
        rd0_o_R4 <= rd0_o_R3;
        rd0_o_R5 <= rd0_o_R4;
        rd1_o_R2 <= rd1_o_R1 ;
        rd1_o_R3 <= rd1_o_R2;
        rd1_o_R4 <= rd1_o_R3;
        rd1_o_R5 <= rd1_o_R4;
        wr0_o_R2 <= wr0_o_R1 ;
        wr0_o_R3 <= wr0_o_R2;
        wr0_o_R4 <= wr0_o_R3;
        wr1_o_R2 <= wr1_o_R1 ;
        wr1_o_R3 <= wr1_o_R2;
        wr1_o_R4 <= wr1_o_R3;
    end
  always @(posedge clk_in)
    begin
      if (
         (rd0_o_R2 & ~rd1_o_R4)                              // pre-am rd if no ped on rnk 1
       | rd0_o_R3                                            // 1st cyc of rd brst
       | rd0_o_R4                                            // 2nd cyc of rd brst
       | (rd0_o_R5 & ~rd1_o_R2 & ~rd1_o_R3)                  // post-rd cyc if no ped on rnk 1
       | (wr0_o_R1)                                          // pre-am wr
       | wr0_o_R2 | wr0_o_R3                                 // wr brst 1st & 2nd cyc
       | (wr0_o_R4)                                          // post-wr cyc (chgef9)
       | wr1_o_R1 | wr1_o_R2 | wr1_o_R3 | wr1_o_R4 // rank 1 (chgef9)
       )
               en_fet_a <= 1'b1;                             // enable fet
      else
               en_fet_a <= 1'b0;                             // disable fet
    end
  always @(posedge clk_in)
        begin
         if (
            (rd1_o_R2 & ~rd0_o_R4)
          | rd1_o_R3
          | rd1_o_R4
          | (rd1_o_R5 & ~rd0_o_R2 & ~rd0_o_R3)
          | (wr1_o_R1)                                       // (chgef8)
          | wr1_o_R2 | wr1_o_R3
        | (wr1_o_R4)                                         // post-wr cyc (chgef9)
        | wr0_o_R1 | wr0_o_R2 | wr0_o_R3 | wr0_o_R4          // rank 0 (chgef9)
               )
                 en_fet_b <= 1'b1;                           //
          else
                 en_fet_b <= 1'b0;
         end
```

Figure 2A:
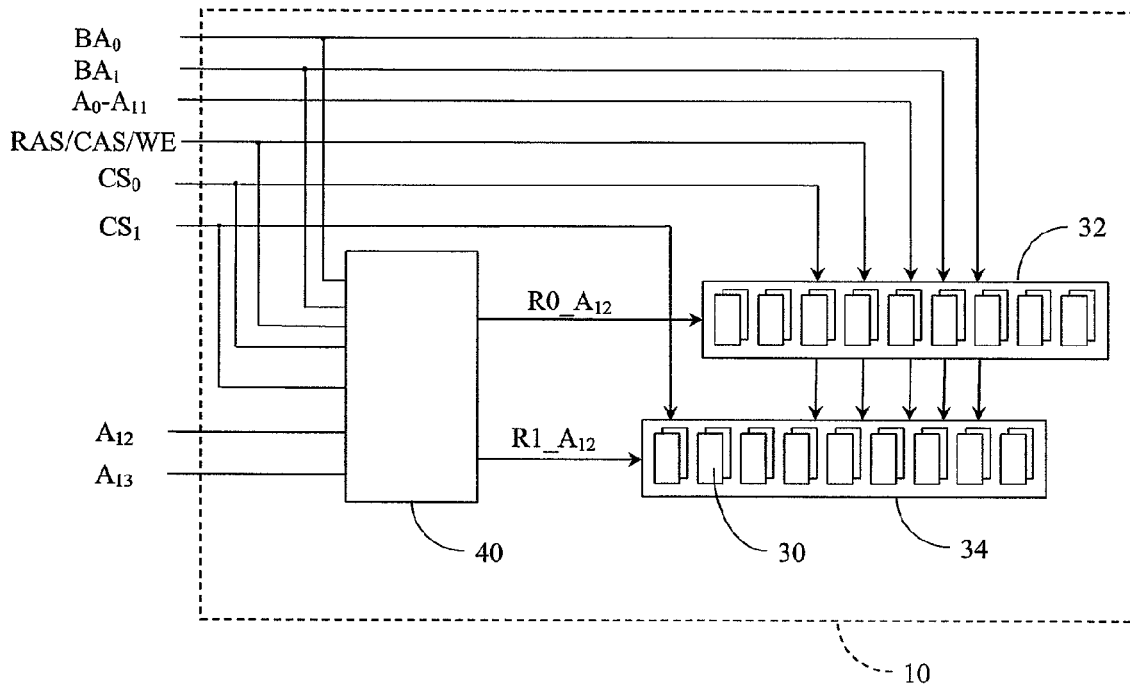
FIG. 2A schematically illustrates an exemplary memory module which doubles the rank density in accordance with certain embodiments described herein.

FIG. 2A schematically illustrates an exemplary memory module 10 which doubles the rank density in accordance with certain embodiments described herein. The memory module 10 has a first memory capacity. The memory module 10 comprises a plurality of substantially identical memory devices 30 configured as a first rank 32 and a second rank 34. In certain embodiments, the memory devices 30 of the first rank 32 are configured in pairs, and the memory devices 30 of the second rank 34 are also configured in pairs. In certain embodiments, the memory devices 30 of the first rank 32 are configured with their respective DQS pins tied together and the memory devices 30 of the second rank 34 are configured with their respective DQS pins tied together, as described more fully below. The memory module 10 further comprises a logic element 40 which receives a first set of address and control signals from a memory controller (not shown) of the computer system. The first set of address and control signals is compatible with a second memory capacity substantially equal to one-half of the first memory capacity. The logic element 40 translates the first set of address and control signals into a second set of address and control signals which is compatible with the first memory capacity of the memory module 10 and which is transmitted to the first rank 32 and the second rank 34.

The first rank 32 of FIG. 2A has 18 memory devices 30 and the second rank 34 of FIG. 2A has 18 memory devices 30. Other numbers of memory devices 30 in each of the ranks 32, 34 are also compatible with embodiments described herein.

In the embodiment schematically illustrated by FIG. 2A, the memory module 10 has a width of 8 bytes (or 64 bits) and each of the memory devices 30 of FIG. 2A has a bit width of 4 bits. The 4-bit-wide ("×4") memory devices 30 of FIG. 2A have one-half the width, but twice the depth of 8-bit-wide ("×8") memory devices. Thus, each pair of "×4" memory devices 30 has the same density as a single "×8" memory device, and pairs of "×4" memory devices 30 can be used instead of individual "×8" memory devices to provide the memory density of the memory module 10. For example, a pair of 512-Mb 128 M×4-bit memory devices has the same memory density as a 1-Gb 128 M×8-bit memory device.

For two "×4" memory devices 30 to work in tandem to mimic a "×8" memory device, the relative DQS pins of the two memory devices 30 in certain embodiments are advantageously tied together, as described more fully below. In addition, to access the memory density of a high-density memory module 10 comprising pairs of "×4" memory devices 30, an additional address line is used. While a high-density memory module comprising individual "×8" memory devices with the next-higher density would also utilize an additional address line, the additional address lines are different in the two memory module configurations.

For example, a 1-Gb 128 M×8-bit DDR-1 DRAM memory device uses row addresses $A_{13}$-$A_0$ and column addresses $A_{11}$ and $A_9$-$A_0$. A pair of 512-Mb 128 M×4-bit DDR-1 DRAM memory devices uses row addresses $A_{12}$-$A_0$ and column addresses $A_{12}$, $A_{11}$, and $A_9$-$A_0$. In certain embodiments, a memory controller of a computer system utilizing a 1-GB 128 M×8 memory module 10 comprising pairs of the 512-Mb 128 M×4 memory devices 30 supplies the address and control signals including the extra row address ($A_{13}$) to the memory module 10. The logic element 40 receives the address and control signals from the memory controller and converts the extra row address ($A_{13}$) into an extra column address ($A_{12}$).

Figure 2B:
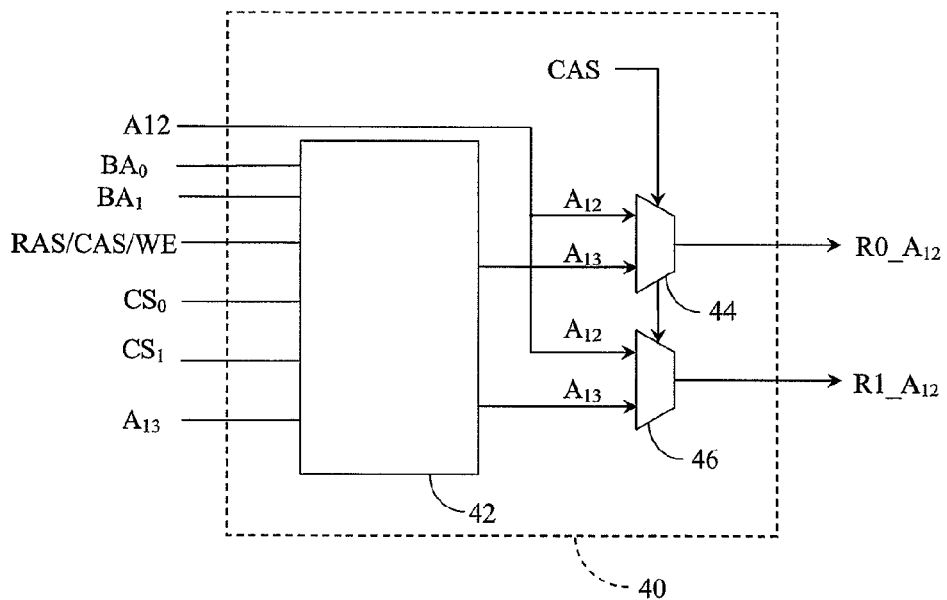
FIG. 2B schematically illustrates an exemplary logic element compatible with embodiments described herein.

FIG. 2B schematically illustrates an exemplary logic element 40 compatible with embodiments described herein. The logic element 40 is used for a memory module 10 comprising pairs of "×4" memory devices 30 which mimic individual "×8" memory devices. In certain embodiments, each pair has the respective DQS pins of the memory devices 30 tied together. In certain embodiments, as schematically illustrated by FIG. 2B, the logic element 40 comprises a programmable-logic device (PLD) 42, a first multiplexer 44 electrically coupled to the first rank 32 of memory devices 30, and a second multiplexer 46 electrically coupled to the second rank 34 of memory devices 30. In certain embodiments, the PLD 42 and the first and second multiplexers 44, 46 are discrete elements, while in other certain embodiments, they are integrated within a single integrated circuit. Persons skilled in the art can select an appropriate PLD 42, first multiplexer 44, and second multiplexer 46 in accordance with embodiments described herein.

In the exemplary logic element 40 of FIG. 2B, during a row access procedure (CAS is high), the first multiplexer 44 passes the $A_{12}$ address through to the first rank 32, the second multiplexer 46 passes the $A_{12}$ address through to the second rank 34, and the PLD 42 saves or latches the $A_{13}$ address from the memory controller. In certain embodiments, a copy of the $A_{13}$ address is saved by the PLD 42 for each of the internal banks (e.g., 4 internal banks) per memory device 30. During a subsequent column access procedure (CAS is low), the first multiplexer 44 passes the previously-saved $A_{13}$ address through to the first rank 32 as the $A_{12}$ address and the second multiplexer 46 passes the previously-saved $A_{13}$ address through to the second rank 34 as the $A_{12}$ address. The first rank 32 and the second rank 34 thus interpret the previously-saved $A_{13}$ row address as the current $A_{12}$ column address. In this way, in certain embodiments, the logic element 40 translates the extra row address into an extra column address in accordance with certain embodiments described herein.

Thus, by allowing two lower-density memory devices to be used rather than one higher-density memory device, certain embodiments described herein provide the advantage of using lower-cost, lower-density memory devices to build "next-generation" higher-density memory modules. Certain embodiments advantageously allow the use of lower-cost readily-available 512-Mb DDR-2 SDRAM devices to replace more expensive 1-Gb DDR-2 SDRAM devices. Certain embodiments advantageously reduce the total cost of the resultant memory module.

Figure 3A:
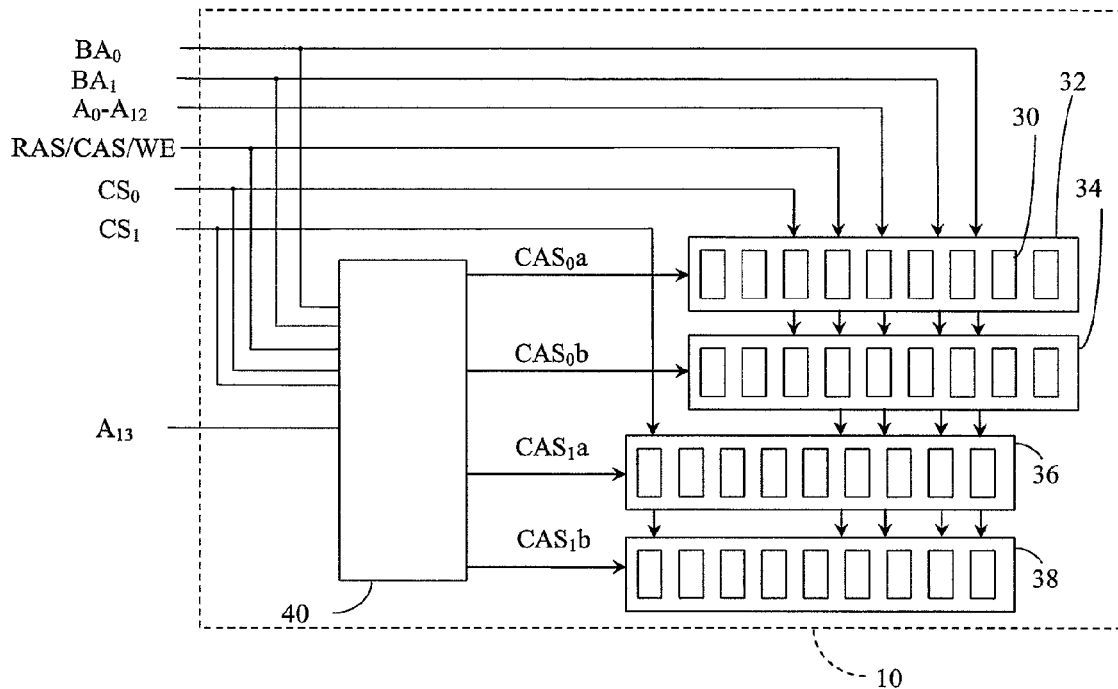
FIG. 3A schematically illustrates an exemplary memory module which doubles number of ranks in accordance with certain embodiments described herein.

FIG. 3A schematically illustrates an exemplary memory module 10 which doubles number of ranks in accordance with certain embodiments described herein. The memory module 10 has a first plurality of memory locations with a first memory density. The memory module 10 comprises a plurality of substantially identical memory devices 30 configured as a first rank 32, a second rank 34, a third rank 36, and a fourth rank 38. The memory module 10 further comprises a logic element 40 which receives a first set of address and control signals from a memory controller (not shown). The first set of address and control signals is compatible with a second plurality of memory locations having a second memory density. The second memory density is substantially equal to one-half of the first memory density. The logic element 40 translates the first set of address and control signals into a second set of address and control signals which is compatible with the first plurality of memory locations of the memory module 10 and which is transmitted to the first rank 32, the second rank 34, the third rank 36, and the fourth rank 38.

Each rank 32, 34, 36, 38 of FIG. 3A has 9 memory devices 30. Other numbers of memory devices 30 in each of the ranks 32, 34, 36, 38 are also compatible with embodiments described herein.

In the embodiment schematically illustrated by FIG. 3A, the memory module 10 has a width of 8 bytes (or 64 bits) and each of the memory devices 30 of FIG. 3A has a bit width of 8 bits. Because the memory module 10 has twice the number of 8-bit-wide ("×8") memory devices 30 as does a standard 8-byte-wide memory module, the memory module 10 has twice the density as does a standard 8-byte-wide memory module. For example, a 1-GB 128 M×8-byte memory module with 36 512-Mb 128 M×8-bit memory devices (arranged in four ranks) has twice the memory density as a 512-Mb 128 M×8-byte memory module with 18 512-Mb 128 M×8-bit memory devices (arranged in two ranks).

Figure 3B:
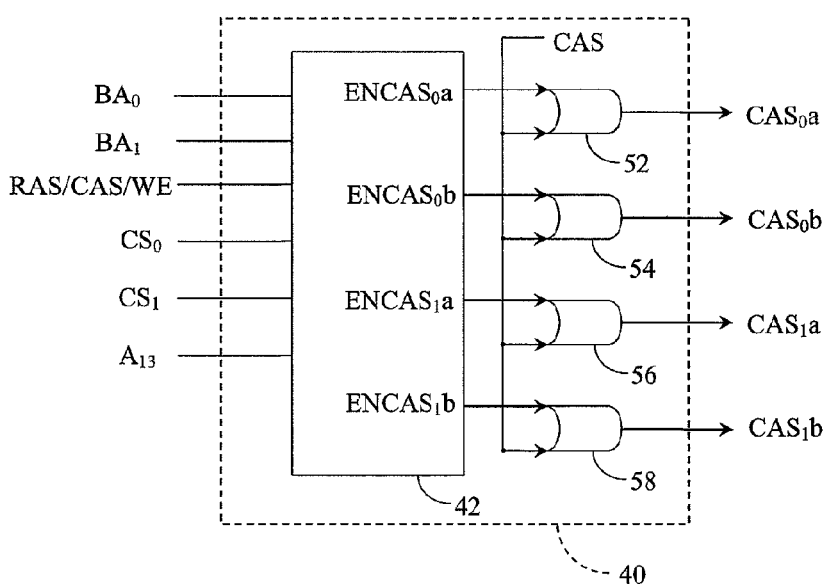
FIG. 3B schematically illustrates an exemplary logic element compatible with embodiments described herein.

To access the additional memory density of the high-density memory module 10, the two chip-select signals ($CS_0$, $CS_1$) are used with other address and control signals to gate a set of four gated CAS signals. For example, to access the additional ranks of four-rank 1-GB 128 M×8-byte DDR-1 DRAM memory module, the $CS_0$ and $CS_1$ signals along with the other address and control signals are used to gate the CAS signal appropriately, as schematically illustrated by FIG. 3A. FIG. 3B schematically illustrates an exemplary logic element 40 compatible with embodiments described herein. In certain embodiments, the logic element 40 comprises a programmable-logic device (PLD) 42 and four "OR" logic elements 52, 54, 56, 58 electrically coupled to corresponding ranks 32, 34, 36, 38 of memory devices 30.

In certain embodiments, the PLD 42 comprises an ASIC, an FPGA, a custom-designed semiconductor device, or a CPLD. In certain embodiments, the PLD 42 and the four "OR" logic elements 52, 54, 56, 58 are discrete elements, while in other certain embodiments, they are integrated within a single integrated circuit. Persons skilled in the art can select an appropriate PLD 42 and appropriate "OR" logic elements 52, 54, 56, 58 in accordance with embodiments described herein.

In the embodiment schematically illustrated by FIG. 3B, the PLD 42 transmits each of the four "enabled CAS" (ENCAS$_0$a, ENCAS$_0$b, ENCAS$_1$a, ENCAS$_1$b) signals to a corresponding one of the "OR" logic elements 52, 54, 56, 58. The CAS signal is also transmitted to each of the four "OR" logic elements 52, 54, 56, 58. The CAS signal and the "enabled CAS" signals are "low" true signals. By selectively activating each of the four "enabled CAS" signals which are inputted into the four "OR" logic elements 52, 54, 56, 58, the PLD 42 is able to select which of the four ranks 32, 34, 36, 38 is active.

In certain embodiments, the PLD 42 uses sequential and combinatorial logic procedures to produce the gated CAS signals which are each transmitted to a corresponding one of the four ranks 32, 34, 36, 38. In certain other embodiments, the PLD 42 instead uses sequential and combinatorial logic procedures to produce four gated chip-select signals (e.g., CS$_0$a, CS$_0$b, CS$_1$a, and CS$_1$b) which are each transmitted to a corresponding one of the four ranks 32, 34, 36, 38.

Back-to-Back Adjacent Read Commands

Figure 4A:
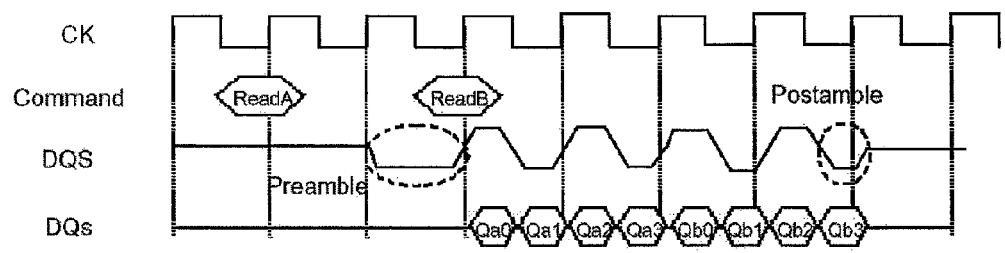
FIG. 4A shows an exemplary timing diagram of a gapless read burst for a back-to-back adjacent read condition from one memory device.

Due to their source synchronous nature, DDR SDRAM (e.g., DDR1, DDR2, DDR3) memory devices operate with a data transfer protocol which surrounds each burst of data strobes with a pre-amble time interval and a post-amble time interval. The pre-amble time interval provides a timing window for the receiving memory device to enable its data capture circuitry when a known valid level is present on the strobe signal to avoid false triggers of the memory device's capture circuit. The post-amble time interval provides extra time after the last strobe for this data capture to facilitate good signal integrity. In certain embodiments, when the computer system accesses two consecutive bursts of data from the same memory device, termed herein as a "back-to-back adjacent read," the post-amble time interval of the first read command and the pre-amble time interval of the second read command are skipped by design protocol to increase read efficiency. FIG. 4A shows an exemplary timing diagram of this "gapless" read burst for a back-to-back adjacent read condition from one memory device.

Figure 4B:
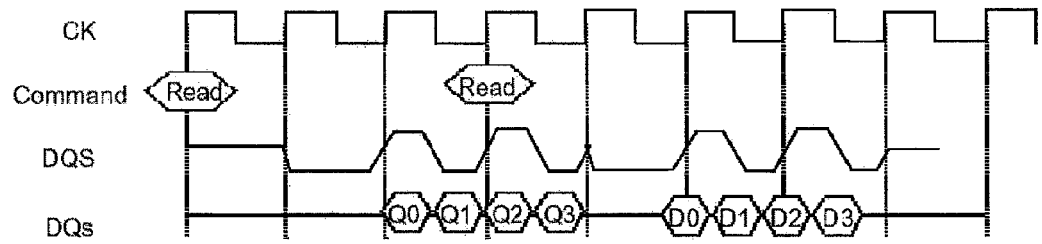
FIG. 4B shows an exemplary timing diagram with an extra clock cycle between successive read commands issued to different memory devices for successive read accesses from different memory devices.

In certain embodiments, when the second read command accesses data from a different memory device than does the first read command, there is at least one time interval (e.g., clock cycle) inserted between the data strobes of the two memory devices. This inserted time interval allows both read data bursts to occur without the post-amble time interval of the first read data burst colliding or otherwise interfering with the pre-amble time interval of the second read data burst. In certain embodiments, the memory controller of the computer system inserts an extra clock cycle between successive read commands issued to different memory devices, as shown in the exemplary timing diagram of FIG. 4B for successive read accesses from different memory devices.

In typical computer systems, the memory controller is informed of the memory boundaries between the ranks of memory of the memory module prior to issuing read commands to the memory module. Such memory controllers can insert wait time intervals or clock cycles to avoid collisions or interference between back-to-back adjacent read commands which cross memory device boundaries, which are referred to herein as "BBARX."

Figure 5:
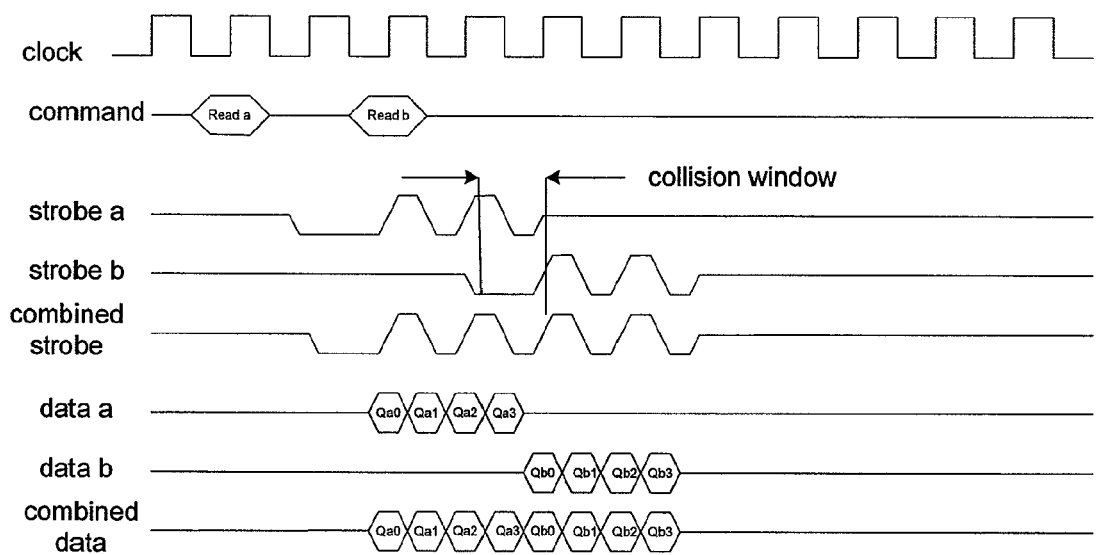
FIG. 5 shows an exemplary timing diagram in which the last data strobe of memory device "a" collides with the preamble time interval of the data strobe of memory device "b."

In certain embodiments described herein in which the number of ranks of the memory module is doubled or quadrupled, the logic element 40 generates a set of output control signals so that the selection decoding is transparent to the computer system. However, in certain such embodiments, there are memory device boundaries of which the computer system is unaware, so there are occasions in which BBARX occurs without the cognizance of the memory controller of the computer system. As shown in FIG. 5, the last data strobe of memory device "a" collides with the pre-amble time interval of the data strobe of memory device "b," resulting in a "collision window."

Figure 6A:
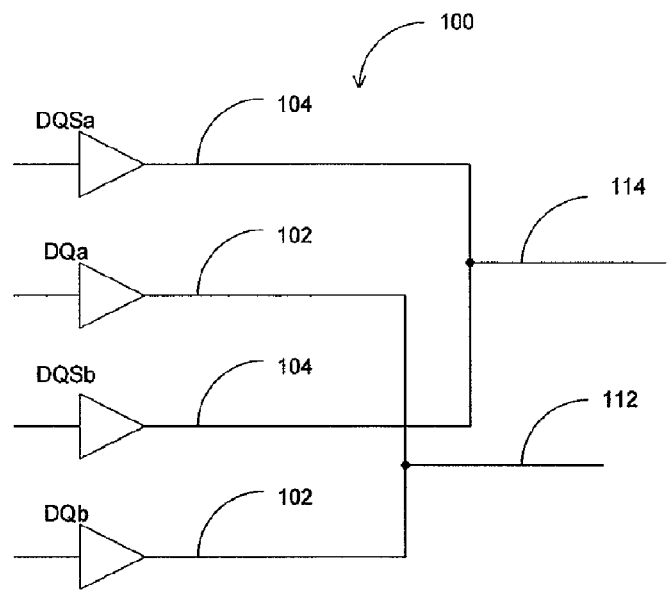
FIG. 6A schematically illustrates a circuit diagram of a conventional memory module showing the interconnections between the DQ data signal lines of two memory devices and their DQS data strobe signal lines.

FIG. 6A schematically illustrates a circuit diagram of a conventional memory module 100 showing the interconnections between the DQ data signal lines 102 of the memory devices "a" and "b" (not shown) and their DQS data strobe signal lines 104. In certain embodiments, the electrical signal lines are etched on the printed circuit board. As shown in FIG. 6A, each of the memory devices has their DQ data signal lines 102 electrically coupled to a common DQ line 112 and the DQS data strobe signal lines 104 electrically coupled to a common DQS line 114.

Figure 6B:
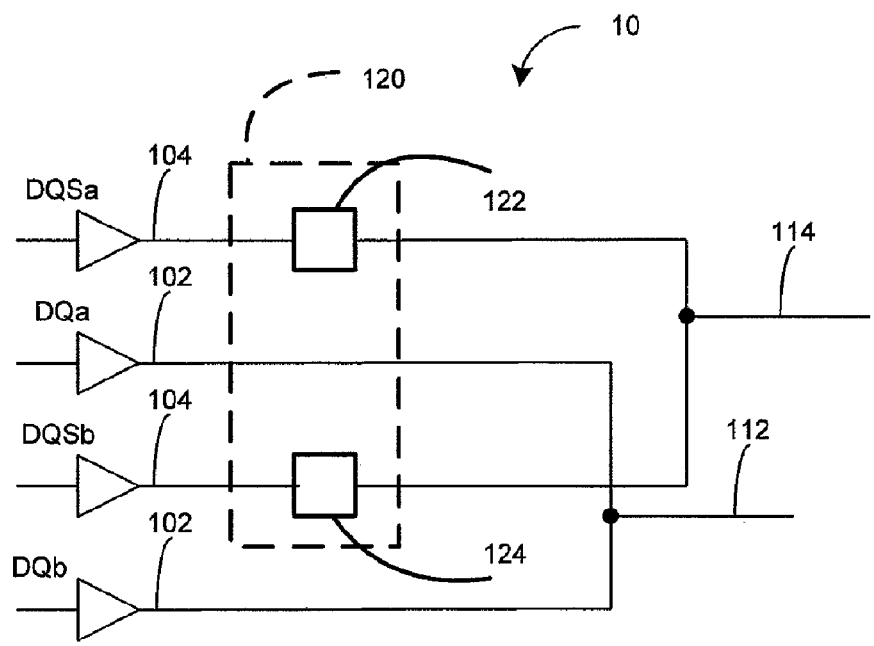
FIG. 6B schematically illustrates a circuit diagram of an exemplary memory module comprising an isolation device in accordance with certain embodiments described herein.

In certain embodiments, BBARX collisions are avoided by a mechanism which electrically isolates the DQS data strobe signal lines 104 of the memory devices from one another during the transition from the first read data burst of one rank of memory devices to the second read data burst of another rank of memory devices. FIG. 6B schematically illustrates a circuit diagram of an exemplary memory module 10 comprising an isolation device 120 in accordance with certain embodiments described herein. As shown in FIG. 6B, each of the memory devices 30 otherwise involved in a BBARX collision have their DQS data strobe signal lines 104 electrically coupled to the common DQS line 114 through the isolation element 120. The isolation device 120 of certain embodiments multiplexes the DQS data strobe signal lines 104 of the two ranks of memory devices 30 from one another to avoid a BBARX collision.

In certain embodiments, as schematically illustrated by FIG. 6B, the isolation device 120 comprises a first switch 122 electrically coupled to a first data strobe signal line (e.g., DQSa) of a first memory device (not shown) and a second switch 124 electrically coupled to a second data strobe signal line (e.g., DQSb) of a second memory device (not shown). Exemplary switches compatible with embodiments described herein include, but are not limited to field-effect transistor (FET) switches, such as the SN74AUC1G66 single bilateral analog switch available from Texas Instruments, Inc. of Dallas, Tex. In certain embodiments, the time for switching the first switch 122 and the second switch 124 is between the two read data bursts (e.g., after the last DQS data strobe of the read data burst of the first memory device and before the first DQS data strobe of the read data burst of the second memory device). During the read data burst for a first memory device, the first switch 122 is enabled. After the last DQS data strobe of the first memory device and before the first DQS data strobe of the second memory device, the first switch 122 is disabled and the second switch 124 is enabled.

Figure 6C:
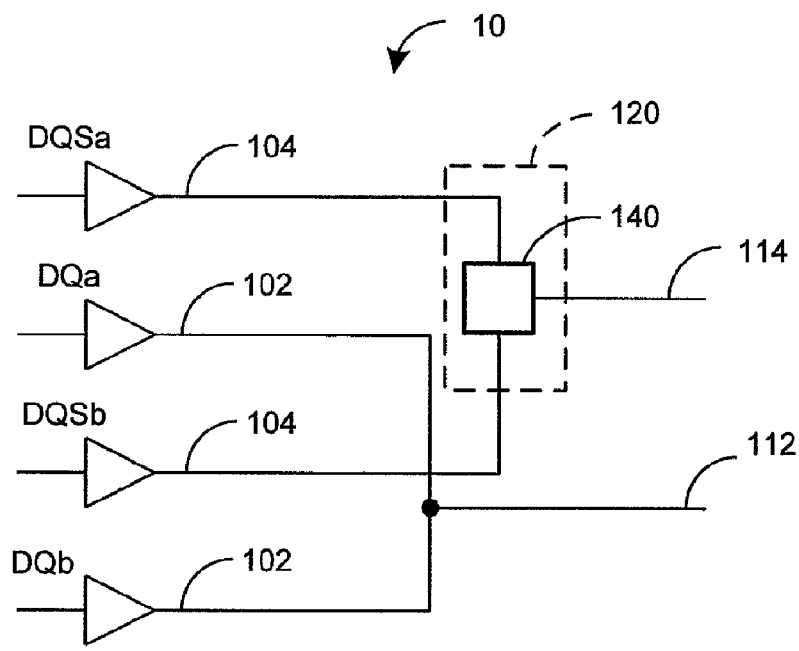
FIG. 6C schematically illustrates an isolation device comprising a logic element which multiplexes the DQS data strobe signal lines from one another.

In certain embodiments, as schematically illustrated by FIG. 6C, the isolation device 120 comprises a logic element 140 which multiplexes the DQS data strobe signal lines 104 from one another. Exemplary logic elements compatible with embodiments described herein include, but are not limited to multiplexers, such as the SN74AUC2G53 2:1 analog multiplexer/demultiplexer available from Texas Instruments, Inc. of Dallas, Tex. The logic element 140 receives a first DQS data strobe signal from the first memory device and a second DQS data strobe signal from a second memory device and selectively switches one of the first and second DQS data strobe signals to the common DQS data strobe signal line 114. Persons skilled in the art can select other types of isolation devices 120 compatible with embodiments described herein.

Figure 6D:
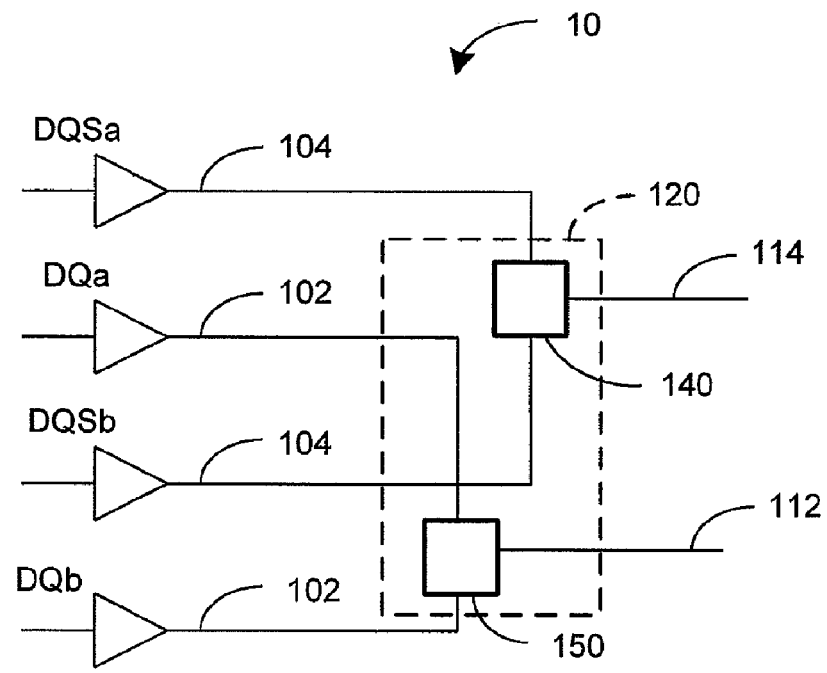
FIG. 6D schematically illustrates an isolation device which multiplexes the DQS data strobe signal lines from one another and which multiplexes the DQ data signal lines from one another.

In certain embodiments, as schematically illustrated by FIG. 6D, the isolation device 120 also multiplexes the DQ data signal lines 102 of the two memory devices from one another. For example, in certain embodiments, the isolation device 120 comprises a pair of switches on the DQ data signal lines 102, similar to the switches 122, 124 on the DQS data strobe signal lines 104 schematically illustrated by FIG. 6B. In certain other embodiments, the isolation device 120 comprises a logic element 150, as schematically illustrated by FIG. 6D. In certain embodiments, the same types of switches and/or logic elements are used for the DQ data signal lines 102 as for the DQS data strobe signal lines 104. The logic element 150 receives a first DQ data signal from the first memory device and a second DQ data signal from the second memory device and selectively switches one of the first and second DQ data signals to the common DQ data signal line 112. Persons skilled in the art can select other types of isolation devices 120 compatible with embodiments described herein.

Figure 6E:
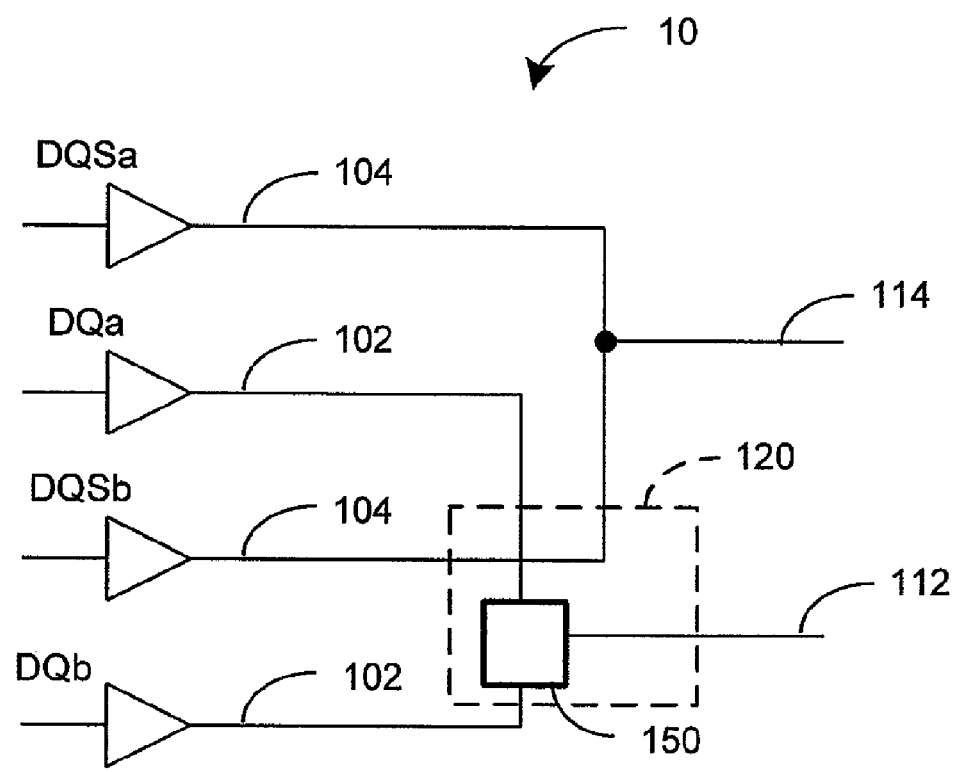
FIG. 6E schematically illustrates an isolation device which comprises the logic element on the DQ data signal lines but not a corresponding logic element on the DQS data strobe signal lines.

In certain embodiments, the isolation device 120 advantageously adds propagation delays to the DQ data signals which match the DQS strobe signals being multiplexed by the isolation device 120. In certain embodiments, the isolation device 120 advantageously presents a reduced impedance load to the computer system by selectively switching between the two ranks of memory devices to which it is coupled. This feature of the isolation device 120 is used in certain embodiments in which there is no memory density multiplication of the memory module (e.g., for a computer system with four chip-select signals), but where the impedance load of the memory module may otherwise limit the number of ranks or the number of memory devices per memory module. As schematically illustrated by FIG. 6E, the isolation device 120 of certain such embodiments comprises the logic element 150 on the DQ data signal lines but not a corresponding logic element on the DQS data strobe signal lines.

In certain embodiments, the control and timing of the isolation device 120 is performed by an isolation-control logic element (e.g., application-specific integrated circuit, custom programmable logic device, field-programmable gate array, etc.) which is resident on the memory module 10. In certain embodiments, the isolation-control logic element is the same logic element 40 as schematically illustrated in FIGS. 1A and 1B, is part of the isolation device 120 (e.g., logic element 140 or logic element 150 as schematically illustrated by FIG. 6D), or is a separate component. The isolation-control logic element of certain embodiments controls the isolation device 120 by monitoring commands received by the memory module 10 from the computer system and producing "windows" of operation whereby the appropriate components of the isolation device 120 are switched to enable and disable the DQS data strobe signal lines 104 to mitigate BBARX collisions. In certain other embodiments, the isolation-control logic element monitors the commands received by the memory module from the computer system and selectively enables and disables the DQ data signal lines 102 to reduce the load impedance of the memory module 10 on the computer system. In still other embodiments, this logic element performs both of these functions together.

Tied Data Strobe Signal Pins

For proper operation, the computer system advantageously recognizes a 1-GB memory module comprising 256-Mb memory devices with 64 M×4-bit configuration as a 1-GB memory module having 512-Mb memory devices with 64 M×8-bit configuration (e.g., as a 1-GB memory module with 128 M×8-byte configuration). This advantageous result is desirably achieved in certain embodiments by electrically connecting together two output signal pins (e.g., DQS or data strobe pins) of the two 256-Mb memory devices such that both output signal pins are concurrently active when the two memory devices are concurrently enabled. The DQS or data strobe is a bi-directional signal that is used during both read cycles and write cycles to validate or latch data. As used herein, the terms "tying together" or "tied together" refer to a configuration in which corresponding pins (e.g., DQS pins) of two memory devices are electrically connected together and are concurrently active when the two memory devices are concurrently enabled (e.g., by a common chip-select or CS signal). Such a configuration is different from standard memory module configurations in which the output signal pins (e.g., DQS pins) of two memory devices are electrically coupled to the same source, but these pins are not concurrently active since the memory devices are not concurrently enabled. However, a general guideline of memory module design warns against tying together two output signal pins in this way.

Figure 7:
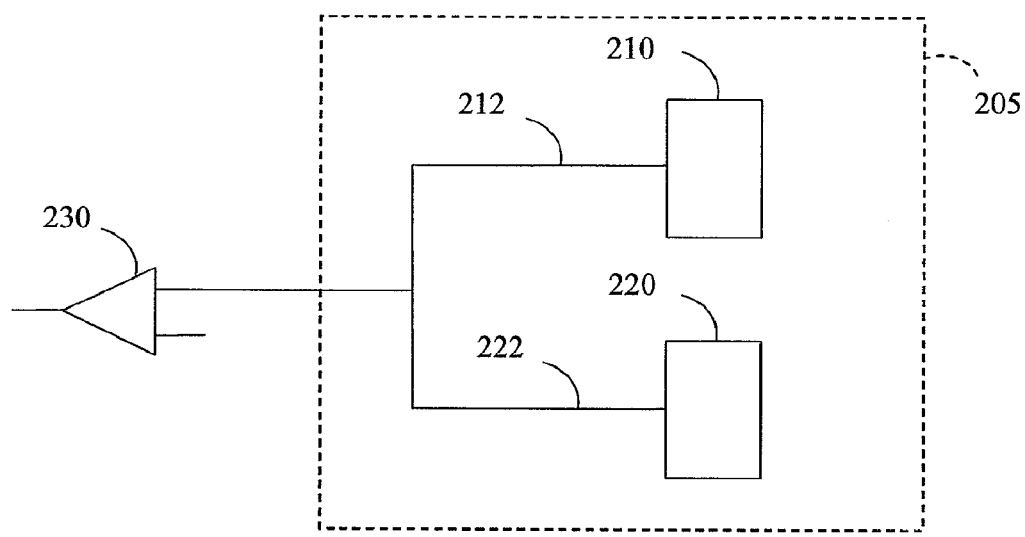
FIG. 7 schematically illustrates an exemplary memory module in which a data strobe (DQS) pin of a first memory device is electrically connected to a DQS pin of a second memory device while both DQS pins are active.
Figure 8:
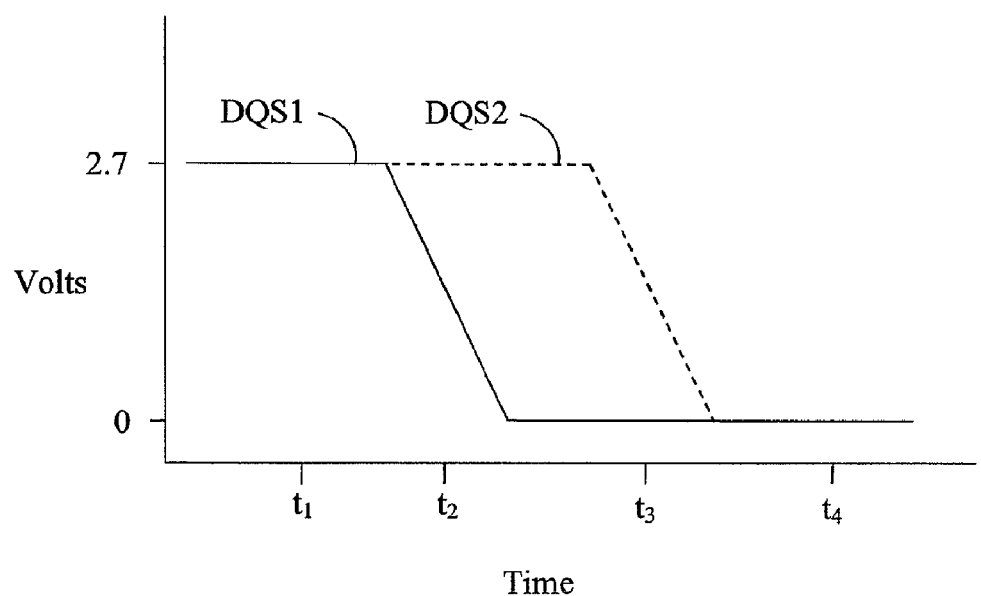
FIG. 8 is an exemplary timing diagram of the voltages applied to the two DQS pins due to non-simultaneous switching.

FIGS. 7 and 8 schematically illustrate a problem which may arise from tying together two output signal pins. FIG. 7 schematically illustrates an exemplary memory module 205 in which a first DQS pin 212 of a first memory device 210 is electrically connected to a second DQS pin 222 of a second memory device 220. The two DQS pins 212, 222 are both electrically connected to a memory controller 230.

FIG. 8 is an exemplary timing diagram of the voltages applied to the two DQS pins 212, 222 due to non-simultaneous switching. As illustrated by FIG. 8, at time $t_1$, both the first DQS pin 212 and the second DQS pin 222 are high, so no current flows between them. Similarly, at time $t_4$, both the first DQS pin 212 and the second DQS pin 222 are low, so no current flows between them. However, for times between approximately $t_2$ and approximately $t_3$, the first DQS pin 212 is low while the second DQS pin 222 is high. Under such conditions, a current will flow between the two DQS pins 212, 222. This condition in which one DQS pin is low while the other DQS pin is high can occur for fractions of a second (e.g., 0.8 nanoseconds) during the dynamic random-access memory (DRAM) read cycle. During such conditions, the current flowing between the two DQS pins 212, 222 can be substantial, resulting in heating of the memory devices 210, 220, and contributing to the degradation of reliability and eventual failure of these memory devices.

Figure 9:
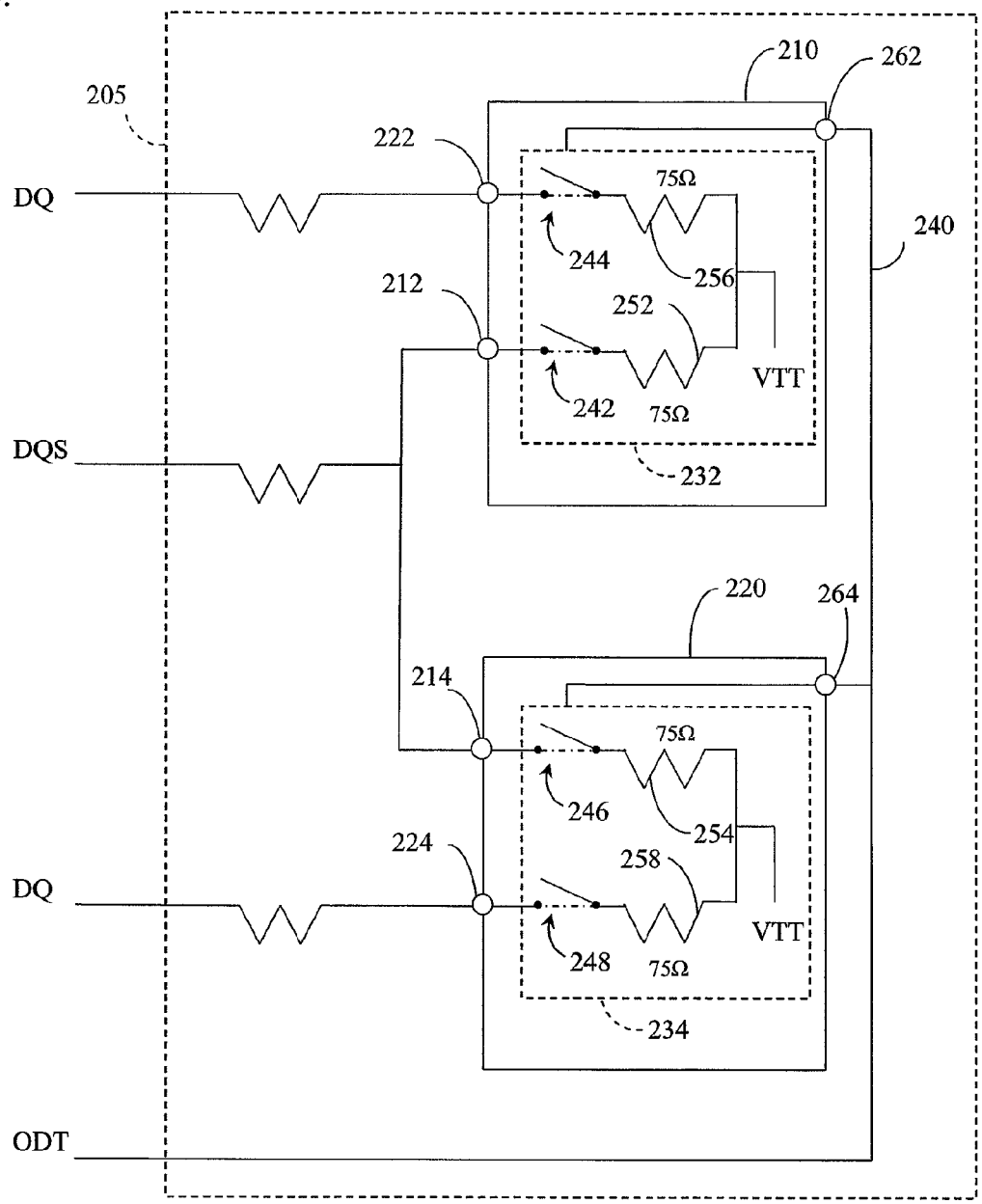
FIG. 9 schematically illustrates another exemplary memory module in which a DQS pin of a first memory device is connected to a DQS pin of a second memory device.

A second problem may also arise from tying together two output signal pins. FIG. 9 schematically illustrates another exemplary memory module 205 in which a first DQS pin 212 of a first memory device 210 is electrically connected to a second DQS pin 214 of a second memory device 220. The two DQS pins 212, 214 of FIG. 9 are both electrically connected to a memory controller (not shown). The DQ (data input/output) pin 222 of the first memory device 210 and the corresponding DQ pin 224 of the second memory device 220 are each electrically connected to the memory controller by the DQ bus (not shown). Typically, each memory device 210, 220 will have a plurality of DQ pins (e.g., eight DQ pins per memory device), but for simplicity, FIG. 9 only shows one DQ pin for each memory device 210, 220.

Each of the memory devices 210, 220 of FIG. 9 utilizes a respective on-die termination or "ODT" circuit 232, 234 which has termination resistors (e.g., 75 ohms) internal to the memory devices 210, 220 to provide signal termination. Each memory device 210, 220 has a corresponding ODT signal pin 262, 264 which is electrically connected to the memory controller via an ODT bus 240. The ODT signal pin 262 of the first memory device 210 receives a signal from the ODT bus 240 and provides the signal to the ODT circuit 232 of the first memory device 210. The ODT circuit 232 responds to the signal by selectively enabling or disabling the internal termination resistors 252, 256 of the first memory device 210. This behavior is shown schematically in FIG. 9 by the switches 242, 244 which are either closed (dash-dot line) or opened (solid line). The ODT signal pin 264 of the second memory device 220 receives a signal from the ODT bus 240 and provides the signal to the ODT circuit 234 of the second memory device 220. The ODT circuit 234 responds to the signal by selectively enabling or disabling the internal termination resistors 254, 258 of the second memory device 220. This behavior is shown schematically in FIG. 9 by the switches 246, 248 which are either closed (dash-dot line) or opened (solid line). The switches 242, 244, 246, 248 of FIG. 9 are schematic representations of the operation of the ODT circuits 232, 234, and do not signify that the ODT circuits 232, 234 necessarily include mechanical switches.

Examples of memory devices 210, 220 which include such ODT circuits 232, 234 include, but are not limited to, DDR2 memory devices. Such memory devices are configured to selectively enable or disable the termination of the memory device in this way in response to signals applied to the ODT signal pin of the memory device. For example, when the ODT signal pin 262 of the first memory device 210 is pulled high, the termination resistors 252, 256 of the first memory device 210 are enabled. When the ODT signal pin 262 of the first memory device 210 is pulled low (e.g., grounded), the termination resistors 252, 256 of the first memory device 210 are disabled. By selectively disabling the termination resistors of an active memory device, while leaving the termination resistors of inactive memory devices enabled, such configurations advantageously preserve signal strength on the active memory device while continuing to eliminate signal reflections at the bus-die interface of the inactive memory devices.

In certain configurations, as schematically illustrated by FIG. 9, the DQS pins 212, 214 of each memory device 210, 220 are selectively connected to a voltage VTT through a corresponding termination resistor 252, 254 internal to the corresponding memory device 210, 220. Similarly, in certain configurations, as schematically illustrated by FIG. 9, the DQ pins 222, 224 are selectively connected to a voltage VTT through a corresponding termination resistor 256, 258 internal to the corresponding memory device 210, 220. In certain configurations, rather than being connected to a voltage VTT, the DQ pins 222, 224 and/or the DQS pins 212, 214 are selectively connected to ground through the corresponding termination resistors 252, 254, 256, 258. The resistances of the internal termination resistors 252, 254, 256, 258 are selected to clamp the voltages so as to reduce the signal reflections from the corresponding pins. In the configuration schematically illustrated by FIG. 9, each internal termination resistor 252, 254, 256, 258 has a resistance of approximately 75 ohms.

When connecting the first memory device 210 and the second memory device 220 together to form a double word width, both the first memory device 210 and the second memory device 220 are enabled at the same time (e.g., by a common CS signal). Connecting the first memory device 210 and the second memory device 220 by tying the DQS pins 212, 214 together, as shown in FIG. 9, results in a reduced effective termination resistance for the DQS pins 212, 214. For example, for the exemplary configuration of FIG. 9, the effective termination resistance for the DQS pins 212, 214 is approximately 37.5 ohms, which is one-half the desired ODT resistance (for 75-ohm internal termination resistors) to reduce signal reflections since the internal termination resistors 252, 254 of the two memory devices 210, 220 are connected in parallel. This reduction in the termination resistance can result in signal reflections causing the memory device to malfunction.

Figure 10:
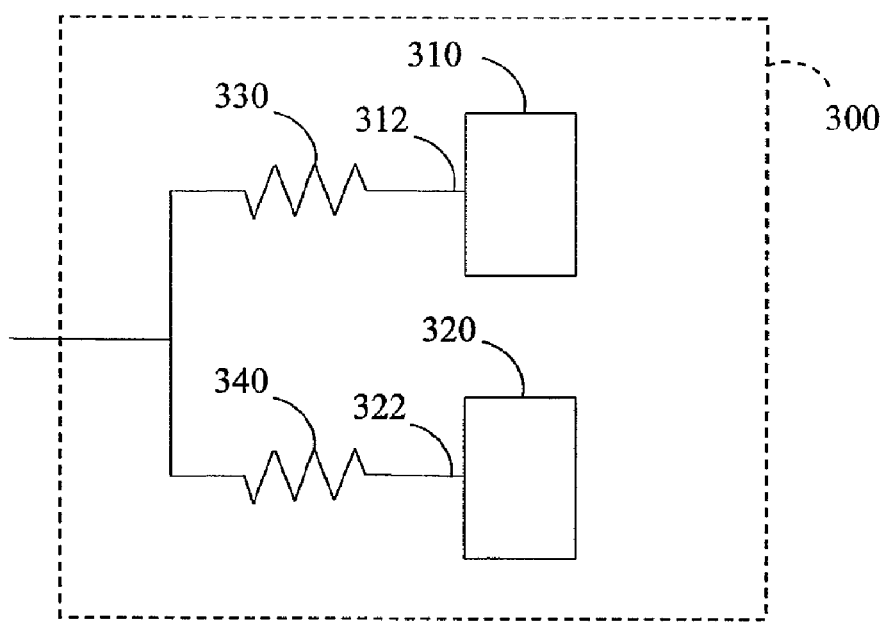
FIG. 10 schematically illustrates an exemplary memory module in accordance with certain embodiments described herein.

FIG. 10 schematically illustrates an exemplary memory module 300 in accordance with certain embodiments described herein. The memory module 300 comprises a first memory device 310 having a first data strobe (DQS) pin 312 and a second memory device 320 having a second data strobe (DQS) pin 322. The memory module 300 further comprises a first resistor 330 electrically coupled to the first DQS pin 312. The memory module 300 further comprises a second resistor 340 electrically coupled to the second DQS pin 322 and to the first resistor 330. The first DQS pin 312 is electrically coupled to the second DQS pin 322 through the first resistor 330 and through the second resistor 340.

Figure 11A:
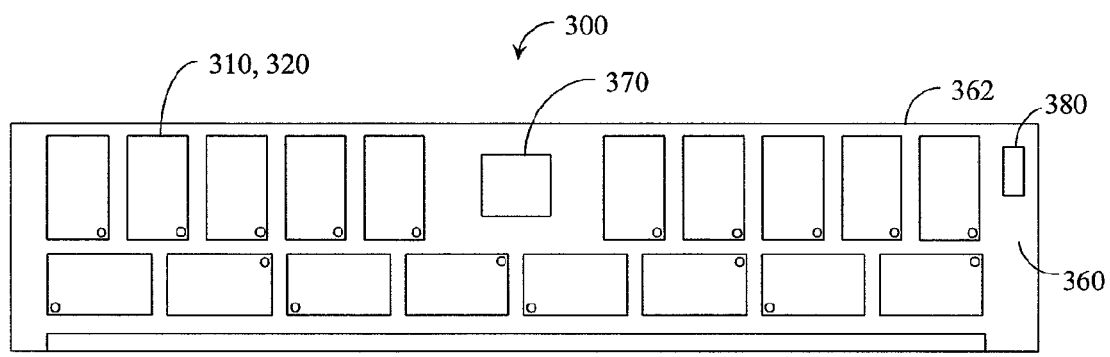
FIGS. 11A and 11B schematically illustrate a first side and a second side, respectively, of a memory module with eighteen 64 M×4 bit, DDR-1 SDRAM FBGA memory devices on each side of a 184-pin glass-epoxy printed circuit board.
Figure 11B:
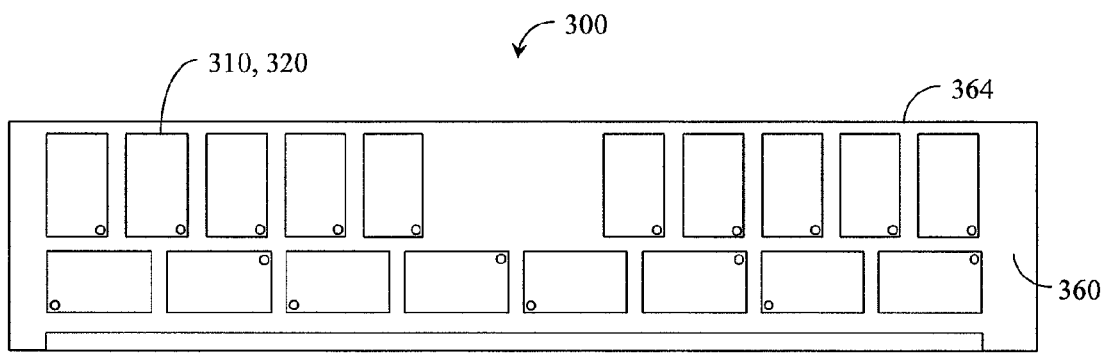

In certain embodiments, the memory module 300 is a 1-GB unbuffered Double Data Rate (DDR) Synchronous Dynamic RAM (SDRAM) high-density dual in-line memory module (DIMM). FIGS. 11A and 11B schematically illustrate a first side 362 and a second side 364, respectively, of such a memory module 300 with eighteen 64 M×4-bit, DDR-1 SDRAM FBGA memory devices on each side of a 184-pin glass-epoxy printed circuit board (PCB) 360. In certain embodiments, the memory module 300 further comprises a phase-lock-loop (PLL) clock driver 370, an EEPROM for serial-presence detect (SPD) data 380, and decoupling capacitors (not shown) mounted on the PCB in parallel to suppress switching noise on VDD and VDDQ power supply for DDR-1 SDRAM. By using synchronous design, such memory modules 300 allow precise control of data transfer between the memory module 300 and the system controller. Data transfer can take place on both edges of the DQS signal at various operating frequencies and programming latencies. Therefore, certain such memory modules 300 are suitable for a variety of high-performance system applications.

In certain embodiments, the memory module 300 comprises a plurality of memory devices configured in pairs, each pair having a first memory device 310 and a second memory device 320. For example, in certain embodiments, a 128 M×72-bit DDR SDRAM high-density memory module 300 comprises thirty-six 64 M×4-bit DDR-1 SDRAM integrated circuits in FBGA packages configured in eighteen pairs. The first memory device 310 of each pair has the first DQS pin 312 electrically coupled to the second DQS pin 322 of the second memory device 320 of the pair. In addition, the first DQS pin 312 and the second DQS pin 322 are concurrently active when the first memory device 310 and the second memory device 320 are concurrently enabled.

In certain embodiments, the first resistor 330 and the second resistor 340 each has a resistance advantageously selected to reduce the current flow between the first DQS pin 312 and the second DQS pin 322 while allowing signals to propagate between the memory controller and the DQS pins 312, 322. In certain embodiments, each of the first resistor 330 and the second resistor 340 has a resistance in a range between approximately 5 ohms and approximately 50 ohms. For example, in certain embodiments, each of the first resistor 330 and the second resistor 340 has a resistance of approximately 22 ohms. Other resistance values for the first resistor 330 and the second resistor 340 are also compatible with embodiments described herein. In certain embodiments, the first resistor 330 comprises a single resistor, while in other embodiments, the first resistor 330 comprises a plurality of resistors electrically coupled together in series and/or in parallel. Similarly, in certain embodiments, the second resistor 340 comprises a single resistor, while in other embodiments, the second resistor 340 comprises a plurality of resistors electrically coupled together in series and/or in parallel.

Figure 12A:
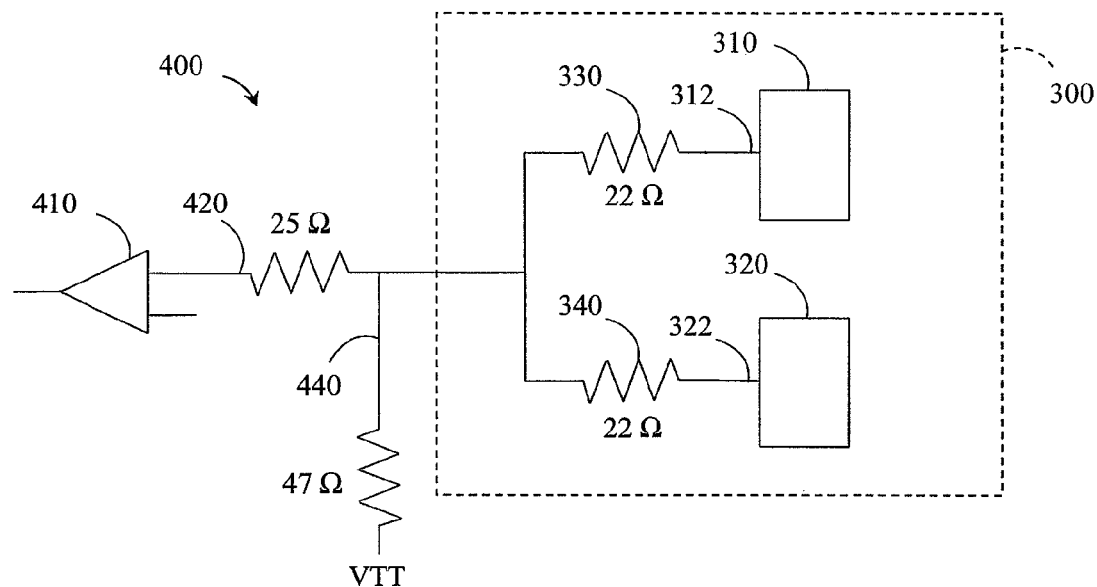
FIGS. 12A and 12B schematically illustrate an exemplary embodiment of a memory module in which a first resistor and a second resistor are used to reduce the current flow between the first DQS pin and the second DQS pin.
Figure 12B:
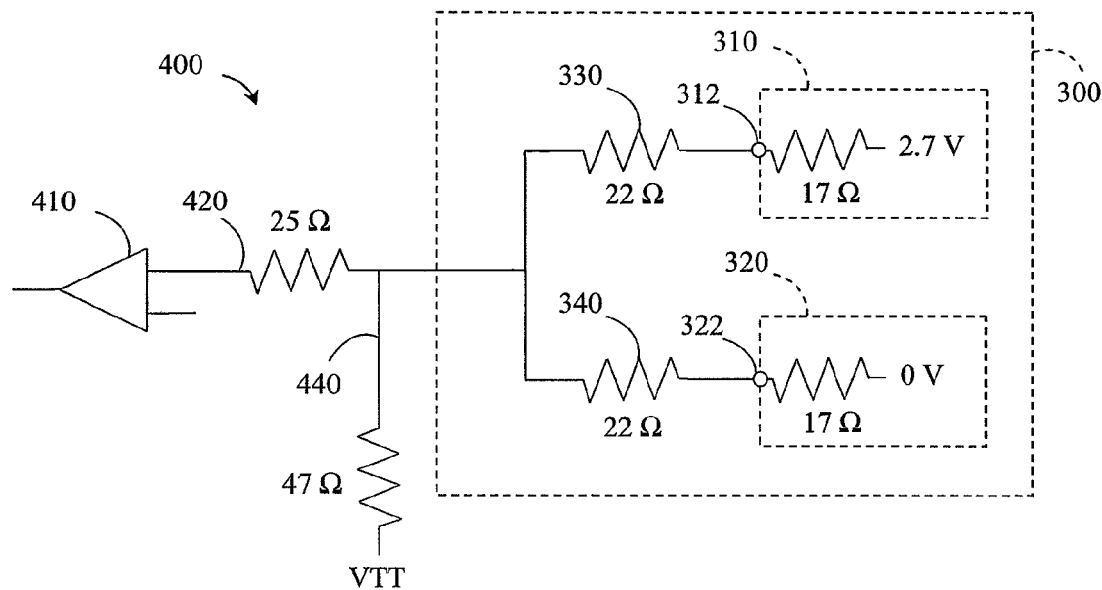

FIGS. 12A and 12B schematically illustrate an exemplary embodiment of a memory module 300 in which the first resistor 330 and the second resistor 340 are used to reduce the current flow between the first DQS pin 312 and the second DQS pin 322. As schematically illustrated by FIG. 12A, the memory module 300 is part of a computer system 400 having a memory controller 410. The first resistor 330 has a resistance of approximately 22 ohms and the second resistor 340 has a resistance of approximately 22 ohms. The first resistor 330 and the second resistor 340 are electrically coupled in parallel to the memory controller 410 through a signal line 420 having a resistance of approximately 25 ohms. The first resistor 330 and the second resistor 340 are also electrically coupled in parallel to a source of a fixed termination voltage (identified by VTT in FIGS. 12A and 12B) by a signal line 440 having a resistance of approximately 47 ohms. Such an embodiment can advantageously be used to allow two memory devices having lower bit widths (e.g., 4-bit) to behave as a single virtual memory device having a higher bit width (e.g., 8-bit).

FIG. 12B schematically illustrates exemplary current-limiting resistors 330, 340 in conjunction with the impedances of the memory devices 310, 320. During an exemplary portion of a data read operation, the memory controller 410 is in a high-impedance condition, the first memory device 310 drives the first DQS pin 312 high (e.g., 2.7 volts), and the second memory device 320 drives the second DQS pin 322 low (e.g., 0 volts). The amount of time for which this condition occurs is approximated by the time between $t_2$ and $t_3$ of FIG. 8, which in certain embodiments is approximately twice the tDQSQ (data strobe edge to output data edge skew time, e.g., approximately 0.8 nanoseconds). At least a portion of this time in certain embodiments is caused by simultaneous switching output (SSO) effects.

In certain embodiments, as schematically illustrated by FIG. 12B, the DQS driver of the first memory device 310 has a driver impedance $R_1$ of approximately 17 ohms, and the DQS driver of the second memory device 320 has a driver impedance $R_4$ of approximately 17 ohms. Because the upper network of the first memory device 310 and the first resistor 330 (with a resistance $R_2$ of approximately 22 ohms) is approximately equal to the lower network of the second memory device 320 and the second resistor 340 (with a resistance $R_3$ of approximately 22 ohms), the voltage at the midpoint is approximately 0.5*(2.7−0)=1.35 volts, which equals VTT, such that the current flow across the 47-ohm resistor of FIG. 12B is approximately zero.

The voltage at the second DQS pin 322 in FIG. 12B is given by $V_{DQS2}=//2.7*R_4/(R_1+R_2+R_3+R_4)=0.59$ volts and the current flowing through the second DQS pin 322 is given by $I_{DQS2}=0.59/R_4=34$ milliamps. The power dissipation in the DQS driver of the second memory device 320 is thus $P_{DQS2}=34$ mA*0.59 V=20 milliwatts. In contrast, without the first resistor 330 and the second resistor 340, only the 17-ohm impedances of the two memory devices 310, 320 would limit the current flow between the two DQS pins 312, 322, and the power dissipation in the DQS driver of the second memory device 320 would be approximately 107 milliwatts. Therefore, the first resistor 330 and the second resistor 340 of FIGS. 12A and 12B advantageously limit the current flowing between the two memory devices during the time that the DQS pin of one memory device is driven high and the DQS pin of the other memory device is driven low.

In certain embodiments in which there is overshoot or undershoot of the voltages, the amount of current flow can be higher than those expected for nominal voltage values. Therefore, in certain embodiments, the resistances of the first resistor 330 and the second resistor 340 are advantageously selected to account for such overshoot/undershoot of voltages.

For certain such embodiments in which the voltage at the second DQS pin 322 is $V_{DQS2}=0.59$ volts and the duration of the overdrive condition is approximately 0.8 nanoseconds at maximum, the total surge is approximately 0.59 V*1.2 ns=0.3 V-ns. For comparison, the JEDEC standard for overshoot/undershoot is 2.4 V-ns, so certain embodiments described herein advantageously keep the total surge within predetermined standards (e.g., JEDEC standards).

Figure 13:
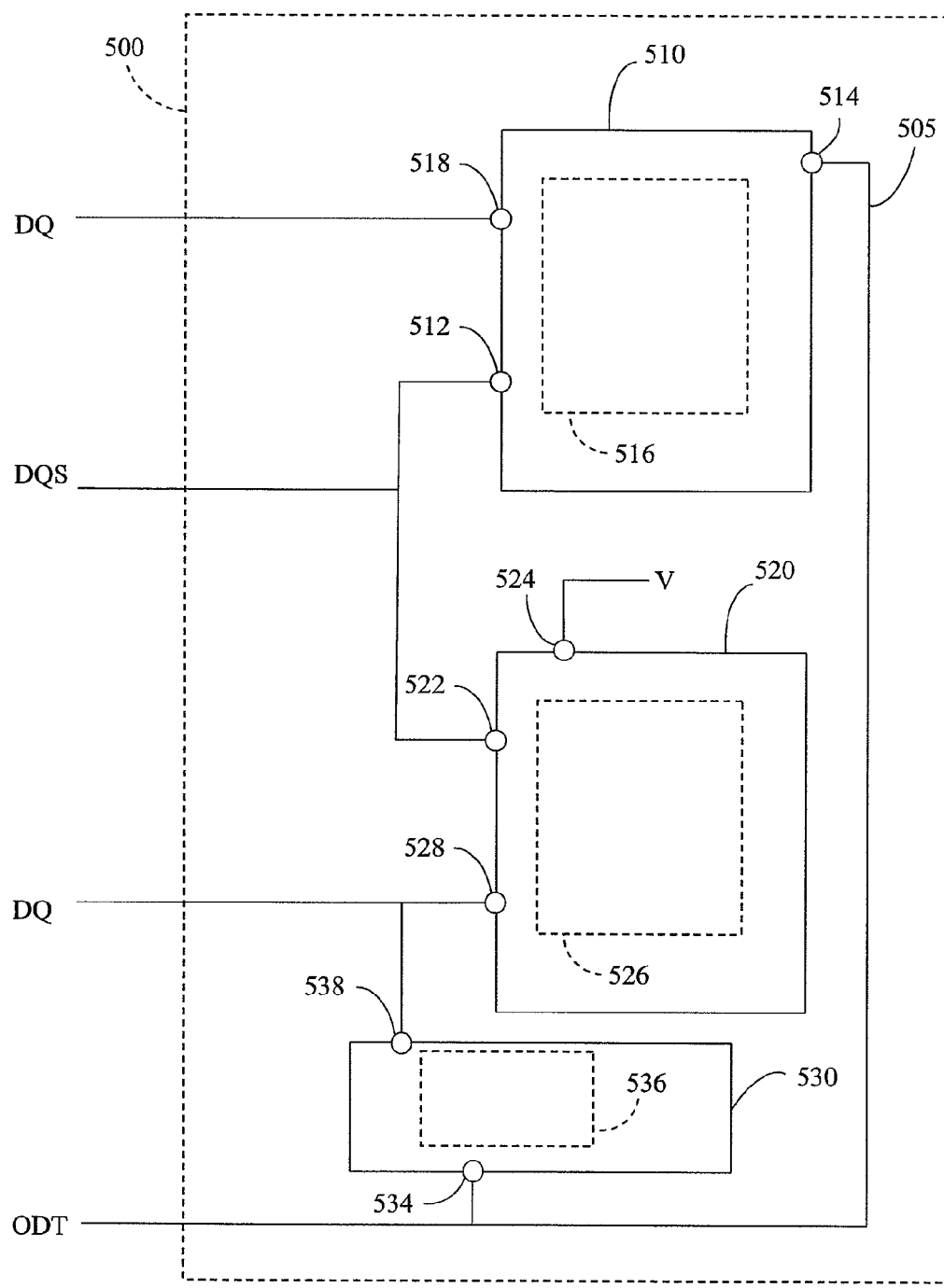
FIG. 13 schematically illustrates another exemplary memory module compatible with certain embodiments described herein.

FIG. 13 schematically illustrates another exemplary memory module 500 compatible with certain embodiments described herein. The memory module 500 comprises a termination bus 505. The memory module 500 further comprises a first memory device 510 having a first data strobe pin 512, a first termination signal pin 514 electrically coupled to the termination bus 505, a first termination circuit 516, and at least one data pin 518. The first termination circuit 516 selectively electrically terminating the first data strobe pin 512 and the first data pin 518 in response to a first signal received by the first termination signal pin 514 from the termination bus 505. The memory module 500 further comprises a second memory device 520 having a second data strobe pin 522 electrically coupled to the first data strobe pin 512, a second termination signal pin 524, a second termination circuit 526, and at least one data pin 528. The second termination signal pin 524 is electrically coupled to a voltage, wherein the second termination circuit 526 is responsive to the voltage by not terminating the second data strobe pin 522 or the second data pin 528. The memory module 500 further comprises at least one termination assembly 530 having a third termination signal pin 534, a third termination circuit 536, and at least one termination pin 538 electrically coupled to the data pin 528 of the second memory device 520. The third termination signal pin 534 is electrically coupled to the termination bus 505. The third termination circuit 536 selectively electrically terminates the data pin 528 of the second memory device 520 through the termination pin 538 in response to a second signal received by the third termination signal pin 534 from the termination bus 505.

Figure 14:
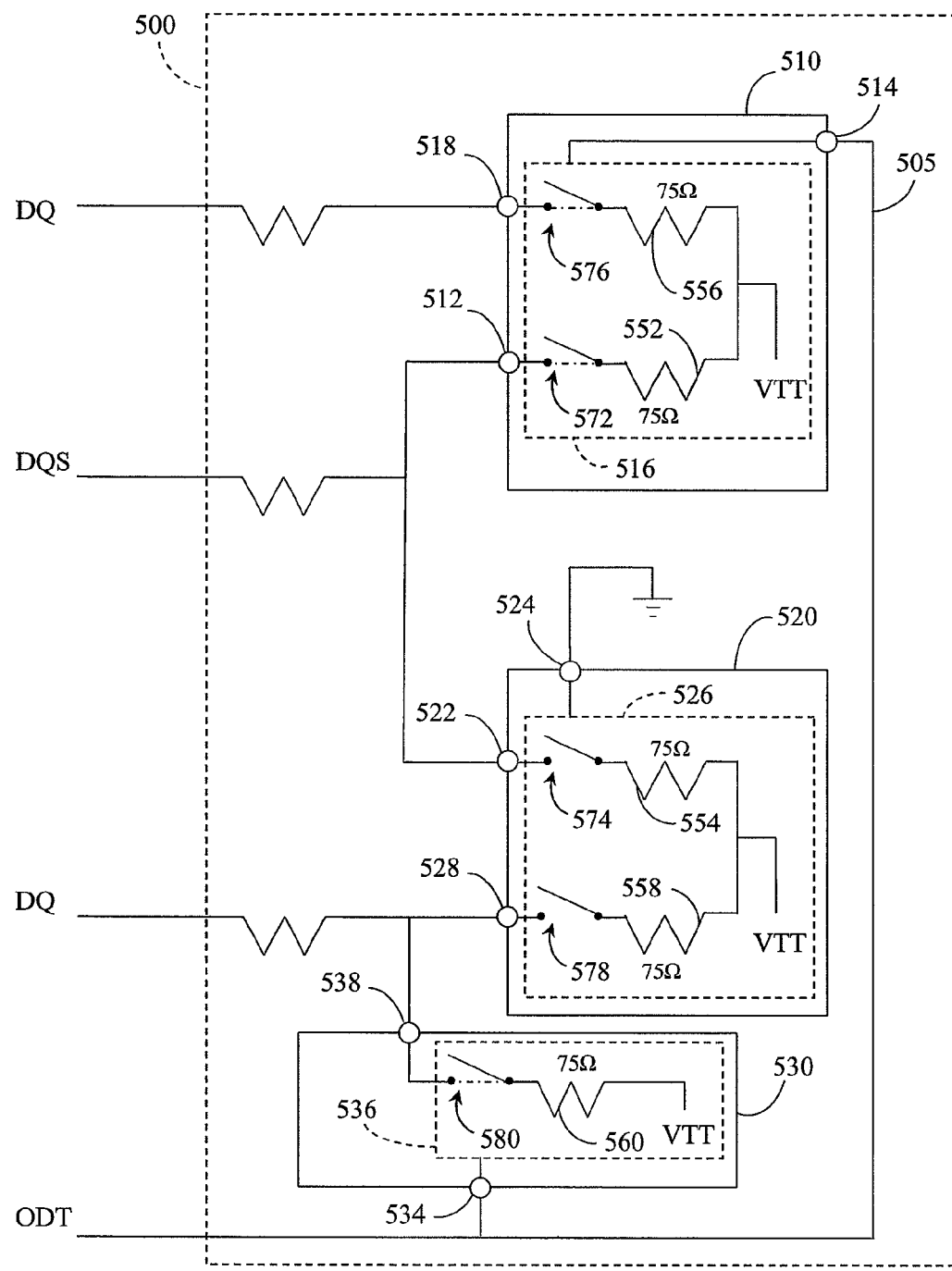
FIG. 14 schematically illustrates a particular embodiment of the memory module schematically illustrated by FIG. 13.

FIG. 14 schematically illustrates a particular embodiment of the memory module 500 schematically illustrated by FIG. 13. The memory module 500 comprises an on-die termination (ODT) bus 505. The memory module 500 comprises a first memory device 510 having a first data strobe (DQS) pin 512, a first ODT signal pin 514 electrically coupled to the ODT bus 505, a first ODT circuit 516, and at least one data (DQ) pin 518. The first ODT circuit 516 selectively electrically terminates the first DQS pin 512 and the DQ pin 518 of the first memory device 510 in response to an ODT signal received by the first ODT signal pin 514 from the ODT bus 505. This behavior of the first ODT circuit 516 is schematically illustrated in FIG. 14 by the switches 572, 576 which are selectively closed (dash-dot line) or opened (solid line).

The memory module 500 further comprises a second memory device 520 having a second DQS pin 522 electrically coupled to the first DQS pin 512, a second ODT signal pin 524, a second ODT circuit 526, and at least one DQ pin 528. The first DQS pin 512 and the second DQS pin 522 are concurrently active when the first memory device 510 and the second memory device 520 are concurrently enabled. The second ODT signal pin 524 is electrically coupled to a voltage (e.g., ground), wherein the second ODT circuit 526 is responsive to the voltage by not terminating the second DQS pin 522 or the second DQ pin 524. This behavior of the second ODT circuit 526 is schematically illustrated in FIG. 14 by the switches 574, 578 which are opened.

The memory module 500 further comprises at least one termination assembly 530 having a third ODT signal pin 534 electrically coupled to the ODT bus 505, a third ODT circuit 536, and at least one termination pin 538 electrically coupled to the DQ pin 528 of the second memory device 520. The third ODT circuit 536 selectively electrically terminates the DQ pin 528 of the second memory device 520 through the termination pin 538 in response to an ODT signal received by the third ODT signal pin 534 from the ODT bus 505. This behavior of the third ODT circuit 536 is schematically illustrated in FIG. 14 by the switch 580 which is either closed (dash-dot line) or opened (solid line).

In certain embodiments, the termination assembly 530 comprises discrete electrical components which are surface-mounted or embedded on the printed-circuit board of the memory module 500. In certain other embodiments, the termination assembly 530 comprises an integrated circuit mounted on the printed-circuit board of the memory module 500. Persons skilled in the art can provide a termination assembly 530 in accordance with embodiments described herein.

Certain embodiments of the memory module 500 schematically illustrated by FIG. 14 advantageously avoid the problem schematically illustrated by FIG. 7 of electrically connecting the internal termination resistances of the DQS pins of the two memory devices in parallel. As described above in relation to FIG. 9, FIGS. 13 and 14 only show one DQ pin for each memory device for simplicity. Other embodiments have a plurality of DQ pins for each memory device. In certain embodiments, each of the first ODT circuit 516, the second ODT circuit 526, and the third ODT circuit 536 are responsive to a high voltage or signal level by enabling the corresponding termination resistors and are responsive to a low voltage or signal level (e.g., ground) by disabling the corresponding termination resistors. In other embodiments, each of the first ODT circuit 516, the second ODT circuit 526, and the third ODT circuit 536 are responsive to a high voltage or signal level by disabling the corresponding termination resistors and are responsive to a low voltage or signal level (e.g., ground) by enabling the corresponding termination resistors. Furthermore, the switches 572, 574, 576, 578, 580 of FIG. 14 are schematic representations of the enabling and disabling operation of the ODT circuits 516, 526, 536 and do not signify that the ODT circuits 516, 526, 536 necessarily include mechanical switches.

The first ODT signal pin 514 of the first memory device 510 receives an ODT signal from the ODT bus 505. In response to this ODT signal, the first ODT circuit 516 selectively enables or disables the termination resistance for both the first DQS pin 512 and the DQ pin 518 of the first memory device 510. The second ODT signal pin 524 of the second memory device 520 is tied (e.g., directly hard-wired) to the voltage (e.g., ground), thereby disabling the internal termination resistors 554, 558 on the second DQS pin 522 and the second DQ pin 528, respectively, of the second memory device 520 (schematically shown by open switches 574, 578 in FIG. 14). The second DQS pin 522 is electrically coupled to the first DQS pin 512, so the termination resistance for both the first DQS pin 512 and the second DQS pin 522 is provided by the termination resistor 552 internal to the first memory device 510.

The termination resistor 556 of the DQ pin 518 of the first memory device 510 is enabled or disabled by the ODT signal received by the first ODT signal pin 514 of the first memory device 510 from the ODT bus 505. The termination resistance of the DQ pin 528 of the second memory device 520 is enabled or disabled by the ODT signal received by the third ODT signal pin 534 of the termination assembly 530 which is external to the second memory device 520. Thus, in certain embodiments, the first ODT signal pin 514 and the third ODT signal pin 534 receive the same ODT signal from the ODT bus 505, and the termination resistances for both the first memory device 510 and the second memory device 520 are selectively enabled or disabled in response thereto when these memory devices are concurrently enabled. In this way, certain embodiments of the memory module 500 schematically illustrated by FIG. 14 provides external or off-chip termination of the second memory device 520.

Certain embodiments of the memory module 500 schematically illustrated by FIG. 14 advantageously allow the use of two lower-cost readily-available 512-Mb DDR-2 SDRAM devices to provide the capabilities of a more expensive 1-GB DDR-2 SDRAM device. Certain such embodiments advantageously reduce the total cost of the resultant memory module 500.

Certain embodiments described herein advantageously increase the memory capacity or memory density per memory slot or socket on the system board of the computer system. Certain embodiments advantageously allow for higher memory capacity in systems with limited memory slots. Certain embodiments advantageously allow for flexibility in system board design by allowing the memory module 10 to be used with computer systems designed for different numbers of ranks (e.g., either with computer systems designed for two-rank memory modules or with computer systems designed for four-rank memory modules). Certain embodiments advantageously provide lower costs of board designs.

In certain embodiments, the memory density of a memory module is advantageously doubled by providing twice as many memory devices as would otherwise be provided. For example, pairs of lower-density memory devices can be substituted for individual higher-density memory devices to reduce costs or to increase performance. As another example, twice the number of memory devices can be used to produce a higher-density memory configuration of the memory module. Each of these examples can be limited by the number of chip select signals which are available from the memory controller or by the size of the memory devices. Certain embodiments described herein advantageously provide a logic mechanism to overcome such limitations.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention.

What is claimed is:

1. A memory module connectable to a computer system, the memory module comprising:
a printed circuit board;
a plurality of double-data-rate (DDR) memory devices mounted to the printed circuit board, the plurality of DDR memory devices having a first number of DDR memory devices arranged in a first number of ranks;
a circuit mounted to the printed circuit board, the circuit comprising a logic element and a register, the logic element receiving a set of input control signals from the computer system, the set of input control signals comprising at least one row/column address signal, bank address signals, and at least one chip-select signal, the set of input control signals corresponding to a second number of DDR memory devices arranged in a second number of ranks, the second number of DDR memory devices smaller than the first number of DDR memory devices and the second number of ranks less than the first number of ranks, the circuit generating a set of output control signals in response to the set of input control signals, the set of output control signals corresponding to the first number of DDR memory devices arranged in the first number of ranks, wherein the circuit further responds to a first command signal and the set of input control signals from the computer system by generating and transmitting a second command signal and the set of output control signals to the plurality of memory devices, the first command signal and the set of input control signals corresponding to the second number of ranks and the second command signal and the set of output control signals corresponding to the first number of ranks; and a phase-lock loop device mounted to the printed circuit board, the phase-lock loop device operatively coupled to the plurality of DDR memory devices, the logic element, and the register.

2. The memory module of claim 1, wherein the circuit is configured to store an input control signal of the set of input control signals during a row access procedure and to transmit the stored input control signal as an output control signal of the set of output control signals during a column access procedure.

3. The memory module of claim 1, wherein the set of input control signals comprises a first number of chip-select signals and wherein the set of output control signals comprises a second number of chip-select signals greater than the first number of chip-select signals.

4. The memory module of claim 3, wherein the first number of chip-select signals is two and the second number of chip-select signals is four.

5. The memory module of claim 1, wherein the circuit receives and buffers a plurality of row/column address signals of the input control signals during a row access procedure and sends the buffered plurality of row/column address signals to the plurality of DDR memory devices during a subsequent column access procedure.

6. The memory module of claim 1, wherein the logic element comprises an application-specific integrated circuit, a field-programmable gate array, a custom-designed semiconductor device, or a complex programmable-logic device.

7. The memory module of claim 1, wherein the bank address signals of the set of input control signals are received by both the logic element and the register.

8. The memory module of claim 1, wherein two or more of the phase-lock loop device, the register, and the logic element are portions of a single component.

9. The memory module of claim 1, wherein the register comprises a plurality of register devices.

10. The memory module of claim 1, wherein the plurality of DDR memory devices is arranged as a first set of DDR memory devices on a first side of the printed circuit board, a second set of DDR memory devices on the first side of the printed circuit board, a third set of DDR memory devices on a second side of the printed circuit board, and a fourth set of DDR memory devices on the second side of the printed circuit board, the DDR memory devices of the second set spaced from the DDR memory devices of the first set, the DDR memory devices of the fourth set spaced from the DDR memory devices of the third set.

11. The memory module of claim 10, wherein the DDR memory devices of the second set are spaced from the DDR memory devices of the first set in a direction along the first side and the memory devices of the fourth set are spaced from the memory devices of the third set in a direction along the second side.

12. The memory module of claim 1, wherein the plurality of DDR memory devices comprises a plurality of DDR2 memory devices arranged in a first rank, a second rank, a third rank, and a fourth rank, the first rank and the second rank on a first side of the printed circuit board, the third rank and the fourth rank on a second side of the printed circuit board, the second side different from the first side.

13. The memory module of claim 12, wherein the first rank is spaced from the second rank and the third rank is spaced from the fourth rank.

14. The memory module of claim 1, wherein the set of input control signals corresponds to a first memory density, and the set of output control signals corresponds to a second memory density, the second memory density greater than the first memory density.

15. A memory module connectable to a computer system, the memory module comprising:

a printed circuit board;

a plurality of double-data-rate (DDR) memory devices coupled to the printed circuit board, the plurality of DDR memory devices having a first number of DDR memory devices arranged in a first number of ranks;

a circuit coupled to the printed circuit board, the circuit comprising a logic element and a register, the logic element receiving a set of input signals from the computer system, the set of input signals comprising at least one row/column address signal, bank address signals, and at least one chip-select signal, the set of input signals configured to control a second number of DDR memory devices arranged in a second number of ranks, the second number of DDR memory devices smaller than the first number of DDR memory devices and the second number of ranks less than the first number of ranks, the circuit generating a set of output signals in response to the set of input signals, the set of output signals configured to control the first number of DDR memory devices arranged in the first number of ranks, wherein the circuit further responds to a command signal and the set of input signals from the computer system by selecting one or two ranks of the first number of ranks and transmitting the command signal to at least one DDR memory device of the selected one or two ranks of the first number of ranks; and a phase-lock loop device coupled to the printed circuit board, the phase-lock loop device operatively coupled to the plurality of DDR memory devices, the logic element, and the register.

16. The memory module of claim 15, wherein the command signal is transmitted to only one DDR memory device at a time.

17. The memory module of claim 16, wherein the command signal comprises a read command signal.

18. The memory module of claim 15, wherein the command signal is transmitted to two ranks of the first number of ranks at a time.

19. The memory module of claim 18, wherein the command signal comprises a refresh command signal.

20. The memory module of claim 18, wherein the command signal is transmitted to the two ranks of the first number of ranks concurrently.

21. The memory module of claim 15, wherein the circuit is configured to store an input signal of the set of input signals during a row access procedure for subsequent use during a column access procedure.

22. The memory module of claim 15, wherein the command signal comprises a read command signal or a write command signal, the set of input signals comprises a density bit which is a row address bit, and the circuit is configured to store the row address bit during an activate command for a selected bank.

23. The memory module of claim 15, wherein the circuit is configured to store an input signal of the set of input signals during a row access procedure and to transmit the stored input signal as an output signal of the set of output signals during a subsequent column access procedure.

24. The memory module of claim 15, wherein the logic element comprises an application-specific integrated circuit, a field-programmable gate array, a custom-designed semiconductor device, or a complex programmable-logic device.

25. The memory module of claim 15, wherein the set of input signals comprises a plurality of row/column address signals received and buffered by the register and sent from the register to the plurality of DDR memory devices.

26. The memory module of claim 25, wherein the logic element receives the bank address signals and the command signal from the computer system and the register receives the bank address signals and the command signal from the computer system.

27. The memory module of claim 15, wherein two or more of the phase-lock loop device, the register, and the logic element are portions of a single component.

28. A memory module connectable to a computer system, the memory module comprising:
    a printed circuit board;
    a plurality of double-data-rate (DDR) dynamic random-access memory (DRAM) devices coupled to the printed circuit board, the plurality of DDR DRAM devices having a first number of DDR DRAM devices arranged in a first number of ranks;
    a circuit coupled to the printed circuit board, the circuit comprising a logic element and a register, the logic element receiving a set of input control signals from the computer system, the set of input control signals comprising a row/column address signal, bank address signals, a chip-select signal, and an input command signal, the set of input control signals configured to control a second number of DDR DRAM devices arranged in a second number of ranks, the second number of DDR DRAM devices smaller than the first number of DDR DRAM devices, the second number of ranks smaller than the first number of ranks, the circuit generating a set of output control signals in response to the set of input control signals, the set of output control signals comprising an output command signal, the set of output control signals configured to control the first number of DDR DRAM devices arranged in the first number of ranks, wherein the circuit further responds to the set of input control signals from the computer system by selecting at least one rank of the first number of ranks and transmitting the set of output control signals to at least one DDR DRAM device of the selected at least one rank; and
    a phase-lock loop device coupled to the printed circuit board, the phase-lock loop device operatively coupled to the plurality of DDR DRAM devices, the logic element, and the register.

29. The memory module of claim 28, wherein the logic element comprises an application-specific integrated circuit, a field-programmable gate array, a custom-designed semiconductor device, or a complex programmable-logic device.

30. The memory module of claim 29, wherein the circuit is configured to store an input control signal of the set of input control signals during a row access procedure and to transmit the stored input control signal as an output control signal of the set of output control signals during a column access procedure.

31. The memory module of claim 28, wherein the set of input control signals comprises fewer chip-select signals than does the set of output control signals.

32. The memory module of claim 31, wherein the set of input control signals comprises two chip-select signals and the set of output control signals comprises four chip-select signals.

33. The memory module of claim 28, wherein the register receives the bank address signals and the input command signal of the set of input control signals.

34. The memory module of claim 28, wherein the first number of ranks is four and the second number of ranks is two.

35. The memory module of claim 28, wherein the first number of ranks is two and the second number of ranks is one.

36. The memory module of claim 28, wherein the input command signal is a refresh signal and the output command signal is a refresh signal.

37. The memory module of claim 28, wherein the input command signal is a precharge signal and the output command signal is a precharge signal.

38. The memory module of claim 28, wherein the input command signal is a read signal or a write signal and the output command signal is a read signal or a write signal.

39. A memory module connectable to a computer system, the memory module comprising:
    a printed circuit board having a first side and a second side;
    a plurality of double-data-rate (DDR) memory devices mounted to the printed circuit board, each DDR memory device comprising one or more banks, the plurality of DDR memory devices arranged in two or more ranks which are selectable by a first number of chip-select signals; and
    at least one integrated circuit element mounted to the printed circuit board, the at least one integrated circuit element comprising a logic element, a register, and a phase-lock loop device operationally coupled to the plurality of DDR memory devices, the logic element, and the register, the at least one integrated circuit element receiving a plurality of input signals from the computer system, the plurality of input signals comprising row address signals, column address signals, bank address signals, command signals, and a second number of chip-select signals less than the first number of chip-select signals, wherein the logic element receives the bank address signals and at least one command signal of the plurality of input signals, the at least one integrated circuit element generating a plurality of output signals in response to the plurality of input signals, the plurality of output signals comprising row address signals, column address signals, bank address signals, command signals, and the first number of chip-select signals, the at least one integrated circuit element further responsive to the plurality of input signals by selecting at least one rank of the two or more ranks and transmitting the plurality of output signals to at least one DDR memory device of the selected at least one rank.

40. The memory module of claim 39, wherein the plurality of output signals corresponds to a first number of DDR memory devices arranged in the two or more ranks which are selectable by the first number of chip-select signals and wherein the plurality of input signals corresponds to a second number of DDR memory devices arranged in ranks which are selectable by the second number of chip-select signals, wherein the memory module simulates a virtual memory module having the second number of DDR memory devices.

41. The memory module of claim 39, wherein the at least one integrated circuit element comprises one or more integrated circuit elements selected from the group consisting of: an application-specific integrated circuit, a field-programmable gate array, a custom-designed semiconductor device, and a complex programmable-logic device.

42. The memory module of claim 39, wherein the row address signals and the column address signals of the plurality of input signals are received and buffered by the register and are sent from the register to the plurality of DDR memory devices.

43. The memory module of claim 42, wherein the logic element receives the second number of chip-select signals.

44. The memory module of claim 43, wherein both the register and the logic element receive the bank address signals and at least one command signal of the plurality of input signals.

45. The memory module of claim 39, wherein two or more of the logic element, the register, and the phase-lock loop device are portions of a single component.

46. The memory module of claim 39, wherein the plurality of DDR memory devices is arranged as the first rank of DDR memory devices on the first side of the printed circuit board, the second rank of DDR memory devices on the first side of the printed circuit board, a third rank of DDR memory devices on the second side of the printed circuit board, and a fourth rank of DDR memory devices on the second side of the printed circuit board, the DDR memory devices of the fourth rank spaced from the DDR memory devices of the third rank.

47. The memory module of claim 39, wherein the DDR memory devices of the second rank are spaced from the DDR memory devices of the first rank in a direction along the first side.

48. The memory module of claim 39, wherein the plurality of DDR memory devices comprises a plurality of DDR2 memory devices arranged in the first rank, the second rank, a third rank, and a fourth rank, the third rank and the fourth rank on the second side of the printed circuit board.

49. The memory module of claim 39, wherein the plurality of input signals corresponds to a first memory density, and the plurality of output signals corresponds to a second memory density, the second memory density greater than the first memory density.

50. The memory module of claim 39, wherein the at least one integrated circuit element is configured to respond to the plurality of input signals by selecting at least one rank of the two or more ranks and transmitting a command signal to at least one DDR memory device of the selected at least one rank.

51. The memory module of claim 39, wherein the at least one integrated circuit element is configured to store a signal of the plurality of input signals during a row access procedure and to transmit the stored signal as an output signal of the plurality of output signals during a column access procedure.

* * * * *

UNITED STATES PATENT AND TRADEMARK OFFICE
CERTIFICATE OF CORRECTION

PATENT NO. : 7,619,912 B2
APPLICATION NO. : 11/862931
DATED : November 17, 2009
INVENTOR(S) : Bhakta et al.

It is certified that error appears in the above-identified patent and that said Letters Patent is hereby corrected as shown below:

Title Page, at page 3 (item 56), column 1, line 29, under Other Publications, please delete "Komaros" and insert -- Kornaros --.

Title Page, at page 3 (item 56), column 1, line 49, under Other Publications, please delete "IPCOM00008164D," and insert -- IPCOM000008164D, --.

Title Page, at page 3 (item 56), column 2, line 18, please delete ""Continuou" and insert -- "Continuous --.

At sheet 4 of 18 (Figure 2B), line 2, please delete "A12" and insert -- $A_{12}$ --.

At column 1, line 55, please delete "230" and insert -- $2^{30}$ --.

At column 1, line 58, please delete "230" and insert -- $2^{30}$ --.

At column 17, line 27, please delete "ens fet3b = dqs cyc b | dqs ncyc b ;" and insert -- ens_fet3b = dqs_cyc_b | dqs_ncyc_b; --.

At column 29, line 59, please delete ""//2.7*R$_4$" and insert -- 2.7*$R_4$ --.

Signed and Sealed this

Tenth Day of August, 2010

David J. Kappos
*Director of the United States Patent and Trademark Office*